(12) United States Patent
Yamaguchi

(10) Patent No.: US 6,172,559 B1
(45) Date of Patent: Jan. 9, 2001

(54) VARIABLE GAIN AMPLIFYING DEVICE

(75) Inventor: Yu Yamaguchi, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/253,026

(22) Filed: Feb. 19, 1999

(30) Foreign Application Priority Data

Feb. 27, 1998 (JP) ................................. 10-047939

(51) Int. Cl.[7] ............... H03F 1/14; H03F 3/68; H03G 3/20
(52) U.S. Cl. .................. 330/51; 330/124 R; 330/129
(58) Field of Search ................... 330/51, 124 R, 330/151, 129, 295

(56) References Cited

U.S. PATENT DOCUMENTS

| 4,833,400 | * | 5/1989 | Boutigny | 330/124 R |
| 5,374,895 | * | 12/1994 | Lee et al. | 330/51 |
| 5,661,434 | * | 8/1997 | Brozovich et al. | 330/51 |
| 5,862,461 | * | 1/1999 | Yoshizawa et al. | 330/124 R |

FOREIGN PATENT DOCUMENTS

| 54-136157 | 10/1979 | (JP) . |
| 56-90610 | 7/1981 | (JP) . |
| 56-90611 | 7/1981 | (JP) . |
| 56-90612 | 7/1981 | (JP) . |
| 4-260209 | 9/1992 | (JP) . |
| 7-162252 | 6/1995 | (JP) . |
| 8-18348 | 1/1996 | (JP) . |
| 9-148852 | 6/1997 | (JP) . |
| 10-32441 | 2/1998 | (JP) . |

* cited by examiner

Primary Examiner—Robert Pascal
Assistant Examiner—Patricia T. Nguyen
(74) Attorney, Agent, or Firm—Sughrue, Mion, Zinn, Macpeak & Seas, PLLC

(57) ABSTRACT

A variable gain amplifying device that improves noise figure and third order intermodulation distortion over a wide range of gain. The device includes n stages (where n is an arbitrary natural number more than 1), each stage containing a variable gain amplifier capable of changing gain in accordance with a respective gain control signal. Through lines for bypassing a respective amplifier are arranged in parallel to the amplifiers. Input stage switches are provided at respective input sides of the variable gain amplifiers to change the output signal to be input to the variable gain amplifier or the through line based on the gain control signal. Output stage switches are provided at respective output sides of the variable gain amplifiers to change the signal to be output from the variable gain amplifier or the through line based on the gain control signal. A control circuit outputs the respective control signals to the stages.

16 Claims, 12 Drawing Sheets

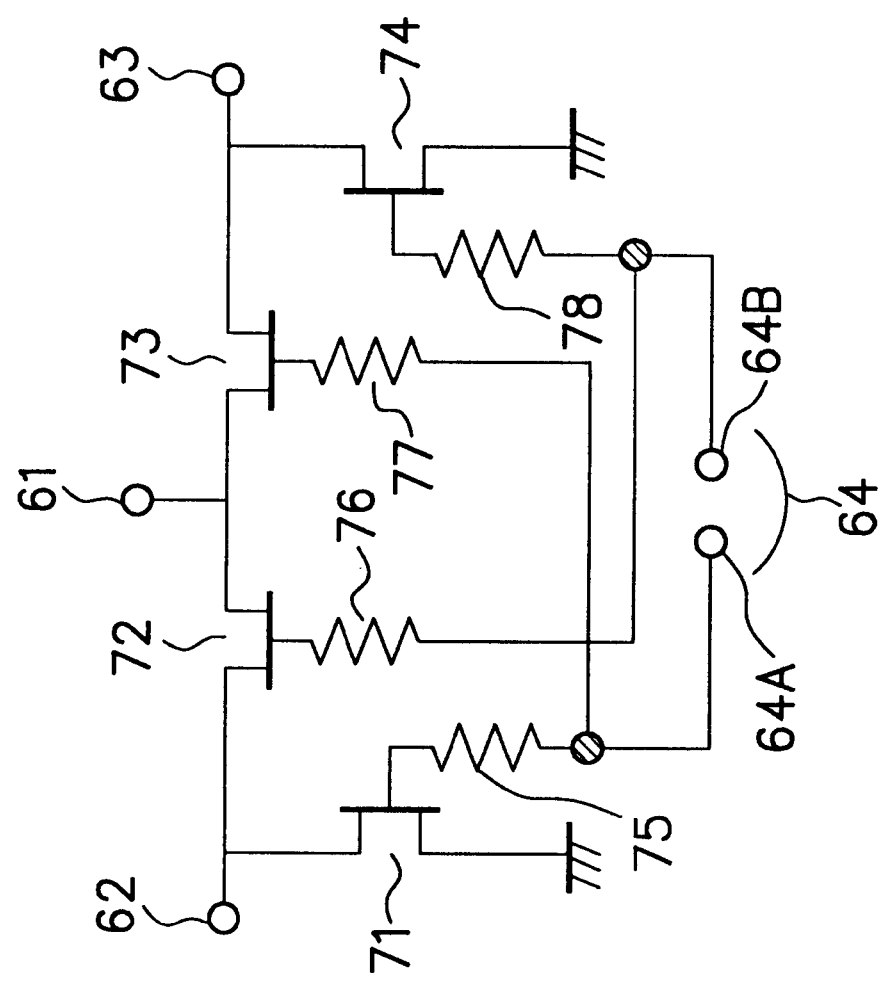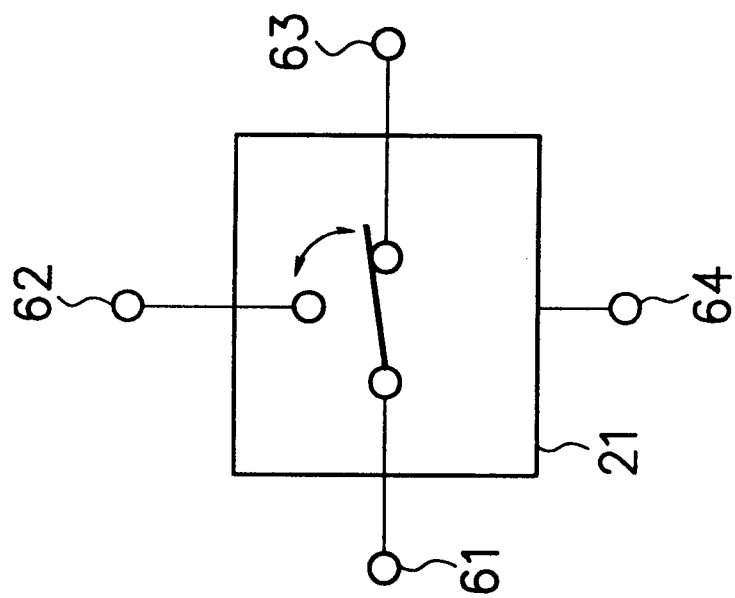

FIG. 17

| INITIAL STAGE [dB] | SECOND STAGE [dB] | LAST STAGE [dB] | TOTAL [dB] | NF [dB] | IM3 [dBc] |
|---|---|---|---|---|---|
| 20 | 18 | 0 | 38 | 3 | 15 |
| 18 | 18 | 2 | 38 | 3.2 | 17 |
| 20 | 0 | 18 | 38 | 3.1 | 24 |
| 18 | 2 | 18 | 38 | 3.2 | 25 |

VARIABLE GAIN AMPLIFYING DEVICE

BACKGROUND OF THE INVENTION

The present invention relates to a variable gain amplifying device. More to particularly this invention relates to a variable gain amplifying device having variable gain amplifiers which are capable of being changed respective gains.

DESCRIPTION OF THE PRIOR ART

At the present time, there is proposed various kinds of variable gain amplifying devices in order to use outputted signals for various kinds of uses.

There is described a configuration of a conventional variable gain amplifying device referring to FIG. 1. FIG. 1 is a circuit view showing one example of a configuration of the conventional variable gain amplifying device. As shown in FIG. 1, variable gain amplifiers 11 to 14 constituted by n stages are connected to a control circuit 3 by gain control signal lines 41 to 44. The control circuit 3 enables gain of the variable gain amplifiers 11 to 14 to be established in every respective amplifiers through the gain control signal lines 41 to 44. With respect to the variable gain amplifiers 11 to 14, generally, the maximum gain is of approximately degree of 15 to 20 dB in every one stage, and the minimum gain is of approximately degree of −10 dB to −30 dB.

Consequently, the signal inputted from an input terminal 1 is outputted from an output terminal 2 with a required gain.

Here, in the above described conventional variable gain amplifying device, negative gain appears to be realizable, however when it permits the gain to be amplified, distortion becomes problem in many cases, therefore, gain establishment range is established to approximately 0 dB to the maximum gain in the majority of cases.

Furthermore, by way of a control method of the gain, there is used a descent type control method in which a point of time of the maximum gain establishment is set as a starting point, and there is obtained required gain while decreasing gain gradually from this point in the majority of cases.

Moreover, by way of methods for decreasing gain, there are many control methods. A first control method is to reduce gain from the initial stage of a variable gain amplifier previously. A second control method is to reduce gain from the final stage of a variable gain amplifier previously. A third control method is to reduce gain from the second stage of the variable gain amplifier previously. A fourth control method is to reduce gain simultaneously of the whole stages of the variable gain amplifiers. The selection out of these control methods is implemented in such a way that more appropriate control method is selected in accordance with required characteristic of the system of the whole device in which the variable gain amplifying device is used.

Moreover, the Japanese Patent Application Laid-open No. SHO 56-90612 discloses "GAIN CONTROL METHOD IN LIGHT SIGNAL OBSERVATION DEVICE" by way of similar prior art to the present invention.

The method of the literature is that when there is observed the light signal, it is capable of being changed gain widely without damaging frequency characteristic in wide band width.

For that reason, the method enables 1 time, 10 times, and 100 times of gain change to be executed by a gain changing device such that the first fixed gain amplifier (wide band width amplifier) or the second fixed gain amplifier of the gain changing device is provided with the by-pass for passing through the signal, as shown in the drawings of the literature.

The Japanese Patent Application Laid-open No. HEI 8-18348 discloses "VARIABLE GAIN AMPLIFIER" by way of the similar prior art to the present invention.

The object of the VARIABLE GAIN AMPLIFIER is to provide a variable gain amplifier which is capable of achieving reduction of power consumption.

For that reason, the VARIABLE GAIN AMPLIFIER causes input/output of the first, the second, and the third fixed gain amplifiers to be changed by the gain changing switches, and causes the power supply switches to be changed timely, to achieve reduction of the power consumption.

The Japanese Patent Application Laid-open No. HEI 9-148852 discloses TRANSMISSION OUTPUT VARIABLE DEVICE by way of the similar prior art to the present invention.

The object of the TRANSMISSION OUTPUT VARIABLE DEVICE is to provide a variable gain amplifier which achieves reduction of the power consumption, together with, which is capable of achieving improvement of CIN distortion.

For that reason, the TRANSMISSION OUTPUT VARIABLE DEVICE enables the power amplifier as the fixed gain amplifier to be provided with the by-pass line so that the signal passes through the by-pass line, furthermore, the change of the gain itself is executed by the variable gain amplifier. Due to the above method, it enables the control characteristic with the exception of the power amplifier, and noise, and distortion characteristic to be improved so that it is capable of being reduced greatly the power consumption caused by the power amplifier which consumes power of the transmission system mainly.

However, there are following problems in the above-described prior art. The first problem is that for instance, in the variable gain amplifiers 11 to 14 as shown in FIG. 1, since a noise figure (simply referring to NF) deteriorates in proportion to reduction of the gain, when individual variable gain amplifier is established to low gain, the NF becomes bad by way of the variable gain amplifying device as a whole. In particular, it is ascertained that when there is established gain of the variable gain amplifying device to the minimum gain, the NF becomes the worst value. Here, there is described change of the value of the NF referring to FIG. 2.

FIG. 2 is a graph showing a relationship between the NF and the gain in the conventional variable gain amplifying device. However, the variable gain amplifying device which is assumed here is a variable gain amplifying device in which the variable gain amplifier is of the three stages configuration. Now, the conventional variable gain amplifying device which has characteristic of the graph shown in FIG. 2 possesses the same constitution as that of the variable gain amplifying device shown in FIG. 1 with the exception that the variable gain amplifier is of the three stages configuration. Hereinafter, there is described it referring to FIG. 1 which shows the conventional variable gain amplifying device.

Furthermore, the result shown in FIG. 2 is a result which is obtained by executing simulation that the variable gain range in every one stage of the variable gain amplifier is set to 0 dB to 20 dB and the relationship between the gain and the NF has the characteristic shown in FIG. 9. Here, FIG. 9 is a graph showing the relationship between the gain in every one stage of the variable gain amplifier used in the present invention and the conventional variable gain amplifying device and the NF.

Moreover, there is implemented four control methods in which it causes the gain to increase to the maximum gain initially by way of gain control method, subsequently, the first control method is to decrease the gain previously from the variable gain amplifier of the initial stage, the second control method is to decrease the gain previously from the variable gain amplifier of the last stage, the third control method is to decrease the gain previously from the variable gain amplifier of the second stage, and the fourth control method is to decrease the gain simultaneously from the variable gain amplifier of the whole stages.

As shown in FIG. 2, there is a difference in the value of the NF at the time of intermediate gain depending on the control method. In all cases, the NF becomes the worst value at the time of minimum gain. At this case, the NF becomes approximately 30 dB.

Consequently, when there is used such the variable gain amplifying device for the receiver's sake of the communication device, the NF of the variable gain amplifier deteriorates the NF of the whole receiver, thus deteriorating property of the receiver.

Next, the second problem is that since the variable gain amplifiers 11 to 14 shown in FIG. 1, generally, permit saturation output power to be lowered with the decreasing of the gain, when the gain thereof is established to low gain, distortion characteristic deteriorates. In particular, it becomes the worst value when the gain is established to the minimum gain. There will be described the relationship between the gain and a third order intermodulation distortion (hereinafter simply referring to IM3) in case where the variable gain amplifier is of the conventional three stage configuration of the variable gain amplifying device. FIG. 3 is a graph showing the relationship the gain and the IM3 in the case of the conventional three stages configuration of the variable gain amplifying device.

Here, the graph shown in FIG. 3, represents the relationship between the gain and an intercept point (hereinafter referring to ICP) with the variable gain range in every one stage of the variable gain amplifiers 11 to 14 as 0 dB to 20 dB, which relationship has the characteristic shown in FIG. 10. FIG. 10 is a graph showing relationship between gain and the ICP of the variable gain amplifier used in the present invention and the conventional variable gain amplifying device. Also FIG. 10 is a result that simulation is executed such that output power level in the output terminal 2 becomes −20 dBm in relation to the input power level of the input terminal 1 shown in FIG. 1.

Furthermore, the gain control is to implement using following four control methods. Initially, it permits the gain to be increased to the maximum gain, subsequently, decreasing the gain from the initial stage of the variable gain amplifier previously (the first control method), decreasing the gain from the last stage of the variable gain amplifier previously (the second control method), decreasing the gain from the second stage of the variable gain amplifier previously (the third control method), and decreasing the gain from the whole stages of the variable gain amplifier simultaneously (the fourth control method).

There is difference as to the value of the IM3 at the time of intermediate gain depending on the control method as shown in FIG. 3. However, the value of the IM3 becomes the worst value at the time when the gain is the minimum value, in this case the worst value becomes approximately 10 dB. When there is used the conventional variable gain amplifying device in the communication device, the IM3 of the variable gain amplifying device causes the IM3 of the whole communication device to deteriorate, thus resulting in deterioration of performance of the communication device.

On the other hand, the device and system disclosed in the Japanese Patent Application Laid-Open No. SHO 56-90612 utilizes the fixed gain amplifier by way of the gain amplifier. It permits the gain to be variable by only changing these connection thereof, therefore, it is impossible to change the gain in suitable accuracy.

Moreover, the device disclosed in the Japanese Patent Application Laid-Open No. HEI 8-18348 which is the same as that of the Japanese Patent Application Laid-open No. SHO 56-90612 utilizes the fixed gain amplifier by way of the gain amplifier. It permits the gain to be variable by only changing these connection thereof, therefore, it is impossible to change the gain in suitable accuracy. Together with, as is clear by referring to the drawing accompanying to the literature, when there is provided a signal route as being the by-pass of the fixed gain amplifier, the signal route is located from respective stages of the amplifier input section to the last stage of the output section. Therefore, when it causes the gain to be changed, inevitably, it should permit the amplifier to be ON successively from the fixed gain amplifier of the front stage, as described hereinafter, it is impossible to select the control method in which it causes the gain as a whole to be established while changing the gain of the amplifier of arbitrary stage by way of the control method of the gain.

Moreover, in the device disclosed in the Japanese Patent Application Laid-open No. HEI 9-148852, which is the same as that of the above Japanese Patent Application Laid-open No. SHO 56-90612 and Japanese Patent Application Laid-open No. HEI 8-18348, there is assumed the fixed gain amplifier of only one stage by way of the gain amplifier with the signal route as being the by-pass, and there is used the variable gain amplifier by way of the amplifier changing gain, thereby, it can not be implemented change of the gain over the wide range.

SUMMARY OF THE INVENTION

In view of the foregoing, it is an object of the present invention in order to achieve the above mentioned problems to provide a variable gain amplifying device which is capable of being improved the NF (Noise Figure) and the IM3 (third order intermodulation distortion) extending wide range of the gain.

According to the first aspect of the present invention, in order to achieve the above-mentioned object, there is provided a variable gain amplifying device which comprises variable gain amplifier of n (with n as arbitrary natural number more than 1) stages capable of changing a gain in accordance with a gain control signal, a through line connected parallel to the respective variable gain amplifiers, an input stage switch provided at respective input sides of the variable gain amplifier for outputting a signal inputted while changing to either one of the variable gain amplifier and the through line based on the control signal an output stage switch provided at respective output sides of the variable gain amplifier for changing to be outputted a signal outputted from either one of the variable gain amplifier and the through line based on the control signal, and a control circuit for outputting the control signal.

According to the second aspect of the present invention as described in the first aspect, wherein at least either one of the input stage switch and the output side switch is Single Pole Dual Through switch.

According to the third aspect of the present invention as described in the first aspect or the second aspect, wherein control of the gain of the variable gain amplifying device is executed by the control signal outputted from the control circuit in such a way that it permits the gain of the variable gain amplifying device to be increased to the maximum value of the gain, subsequently decreasing the gain successively by using at least one control method of following four control methods in which a first control method is that it permits the gain to be decreased previously from an initial stage of the variable gain amplifier to 0 dB, when the gain of the variable gain amplifier of the initial stage becomes 0 dB, decreasing the gain of a variable amplifier of a next stage, when the gain of the variable gain amplifier of the next stage becomes 0 dB, decreasing the gain of a variable gain amplifier of two stages later, thus the gain is decreased previously from the initial stage of the variable gain amplifier, a second control method is that it permits the gain to be decreased previously from a last stage of the variable gain amplifier to 0 dB, when the gain of the variable gain amplifier of the last stage becomes 0 dB, decreasing the gain of a variable gain amplifier of a front stage of the last stage, when the gain of the variable gain amplifier of the front stage becomes 0 dB, decreasing the gain of a variable gain amplifier of a next front stage of the last stage, thus the gain is decreased previously from the last stage of the variable gain amplifier, a third control method is that it permits the gain to be decreased previously from a second stage of the variable gain amplifier to 0 dB, when the gain of the variable gain amplifier of the second stage becomes 0 dB, decreasing the gain of a variable gain amplifier of a next stage (third stage), when the gain of the variable gain amplifier of the next stage (third stage) becomes 0 dB, decreasing the gain of a variable gain amplifier of two next stages, subsequently, when the gain of a variable gain amplifier of the last stage becomes 0 dB, decreasing the gain of the variable gain amplifier of the initial stage, thus the gain is decreased previously from the second stage of the variable gain amplifier, and a fourth control method is that it permits the gain to be decreased simultaneously from the whole stages of the variable gain amplifier.

According to the fourth aspect of the present invention as described in the first aspect or the second aspect, wherein there is executed a control of the gain of the variable gain amplifying device implemented in accordance with a control signal outputted from the control circuit according to a combination of various values of the gain of the variable gain amplifier of the n stages such that values of a noise figure (NF) and a third order intermodulation distortion (IM3) of the variable gain amplifying device become the most appropriate value in the device for which the variable gain amplifying device is in use.

According to the fifth aspect of the present invention as described in any one of the first aspect to the fourth aspect, wherein when the gain of the variable gain amplifier becomes less than 0 dB, the control circuit outputs the control signal in order to change connection of the input stage switch connected to a variable gain amplifier whose gain has become less than 0 dB from the variable gain amplifier into the through line, while when the gain of the variable gain amplifier becomes less than 0 dB, the control circuit outputs the control signal in order to change connection of the output stage switch connected to a variable gain amplifier whose gain has become less than 0 dB from the variable gain amplifier into the through line.

According to the sixth aspect of the present invention, as described in any one of the first aspect to the fifth aspect, wherein there is provided an ON/OFF switch connected to respective the variable gain amplifiers in order to control ON/OFF of a power source of the variable gain amplifier.

According to the seventh aspect of the present invention, as described in the sixth aspect, wherein when the gain of the variable gain amplifier becomes less than 0 dB, the control circuit outputs a control signal causing the ON/OFF switch to be OFF, such the ON/OFF switch is connected to the variable gain amplifier whose gain has become less than 0 dB.

According to the eighth aspect of the present invention, there is provided a variable gain amplifying device which comprises variable gain amplifier of n (with n as arbitrary natural number more than 1) stages capable of changing a gain in accordance with a gain control signal, a buffer amplifier connected parallel to the respective variable gain amplifiers, an input stage switch provided at respective input sides of the variable gain amplifier for outputting a signal inputted while changing to either one of the variable gain amplifier and the buffer amplifier based on the control signal, an output stage switch provided at respective output sides of the variable gain amplifier for changing to be outputted a signal outputted from either one of the variable gain amplifier and the buffer amplifier based on the control signal, and a control circuit for outputting the control signal.

According to the ninth aspect of the present invention, as described in the eighth aspect, wherein at least either one of the input stage switch and the output side switch is Single Pole Dual Through switch.

According to the tenth aspect of the present invention, as described in the eighth aspect or the ninth aspect, wherein control of the gain of the variable gain amplifying device is executed by the control signal outputted from the control circuit in such a way that it permits the gain of the variable gain amplifying device to be increased to the maximum value of the gain, subsequently decreasing the gain successively by using at least one control method of following four control methods in which a first control method is that it permits the gain to be decreased previously from an initial stage of the variable gain amplifier to 0 dB, when the gain of the variable gain amplifier of the initial stage becomes 0 dB, decreasing the gain of a variable amplifier of a next stage, when the gain of the variable gain amplifier of the next stage becomes 0 dB, decreasing the gain of a variable gain amplifier of two stages later, thus the gain is decreased previously from the initial stage of the variable gain amplifier, a second control method is that it permits the gain to be decreased previously from a last stage of the variable gain amplifier to 0 dB, when the gain of the variable gain amplifier of the last stage becomes 0 dB, decreasing the gain of a variable gain amplifier of a front stage of the last stage, when the gain of the variable gain amplifier of the front stage becomes 0 dB, decreasing the gain of a variable gain amplifier of a next front stage of the last stage, thus the gain is decreased previously from the last stage of the variable gain amplifier, a third control method is that it permits the gain to be decreased previously from a second stage of the variable gain amplifier to 0 dB, when the gain of the variable gain amplifier of the second stage becomes 0 dB, decreasing the gain of a variable gain amplifier of a next stage (third stage), when the gain of the variable gain amplifier of the next stage (third stage) becomes 0 dB, decreasing the gain of a variable gain amplifier of two next stages, subsequently, when the gain of a variable gain amplifier of the last stage becomes 0 dB, decreasing the gain of the variable gain amplifier of the initial stage, thus the gain is decreased previously from the second stage of the variable gain amplifier, and a fourth control method is that it permits the gain to be decreased simultaneously from the whole stages of the variable gain amplifier.

According to eleventh aspect of the present invention, as described in the eighth aspect or the ninth aspect, wherein there is executed a control of the gain of the variable gain ampliiying device implemented in accordance with a control signal outputted from the control circuit according to a combination of various values of the gain of the variable gain amplifier of the n stages such that values of a noise figure (NF) and a third order intermodulation distortion (IM3) of the variable gain amplifying device become the most appropriate value in the device for which the variable gain amplifying device is in use.

According to twelfth aspect of the present invention, as described in any one of the eighth aspect to eleventh aspect, wherein when the gain of the variable gain amplifier becomes less than 0 dB, the control circuit outputs the control signal in order to change connection of the input stage switch connected to a variable gain amplifier whose gain has become less than 0 dB from the variable gain amplifier into the buffer amplifier, while when the gain of the variable gain amplifier becomes less than 0 dB, the control circuit outputs the control signal in order to change connection of the output stage switch connected to a variable gain amplifier whose gain has become less than 0 dB from the variable gain amplifier into the buffer amplifier.

According to the thirteenth aspect of the present invention, as described in any one of the eighth aspect to the twelfth aspect, wherein there is provided an ON/OFF switch connected to respective the variable gain amplifiers in order to control ON/OFF of a power source of the variable gain amplifier.

According to the fourteenth aspect of the present invention, as described in the thirteenth aspect, wherein when the gain of the variable gain amplifier becomes less than 0 dB, the control circuit outputs a control signal causing the ON/OFF switch to be OFF, such the ON/OFF switch is connected to the variable gain amplifier whose gain has become less than 0 dB.

According to the fifteenth aspect of the present invention, as described in any one of eighth aspect to the fourteenth aspect, wherein there is provided a buffer amplifier ON/OFF switch connected to respective the buffer amplifiers in order to control ON/OFF of a power source of the buffer amplifier.

According to the sixteenth aspect of the present invention, as described in the fifteenth aspect, wherein when the gain of the variable gain amplifier becomes less than 0 dB, the control circuit outputs a control signal causing the buffer amplifier ON/OFF switch connected in parallel to the variable gain amplifier whose gain has become less than 0 dB to be ON, such the buffer amplifier ON/OFF switch is connected to respective buffer amplifiers, thus causing the buffer amplifier ON/OFF switch to be ON.

Hereinafter, there will be described operation of the variable gain amplifying device according to the present invention. The variable gain amplifying device of the present invention achieves improvement of the noise figure (NF) and the third order inter modulation distortion (IM3) in particular at the time of low gain, in such a way that when the gain of the respective stages becomes less than 0 dB, the variable gain amplifying device causes switch to be changed from the amplifier to the through line or the buffer amplifier such the switch is provided in front or behind of the amplifier.

Here, there will be described operation of the variable gain amplifier of the present invention in detail referring to FIG. 4. FIG. 4 is a circuit view showing a configuration of the first embodiment of the variable gain amplifying device.

In FIG. 4, there are provided input/output change switches 21 to 28 in front and behind of variable gain amplifiers 11 to 14 which is constituted through n stages. There is connected the through lines to another end of the input/output change switches 21 to 28 in parallel to the variable gain amplifiers of respective stages.

The variable gain amplifiers 11 to 14 and the input/output change switches 21 to 28 connected to the control circuit 3 through respective the gain control signal lines 41 to 44 and the switch change signal lines 51 to 54.

The control circuit 3 enables the gain of the variable gain amplifiers 11 to 14 to be established through the gain control signal lines 41 to 44, when the gain of the variable gain amplifiers 11 to 14 is established to more than 0 dB respectively, it causes the input/output change switches 21 to 28 to be connected to the sides of the variable gain amplifiers 11 to 14, while when the gain of the respective stages becomes less than 0 dB, it causes the input/output change switch in front and behind of that stage to be connected to the side of the through lines 31 to 34, thus the amplifier of that stage is separated.

Consequently, the gain of the respective variable gain amplifier becomes less than 0 dB, the variable gain amplifier whose gain has become less than 0 dB is separated from the device, thus it is capable of being achieved the improvement of the noise figure (NF) and the third order intermodulation distortion (IM3) at the time of low gain.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIGS. 5A and 5B are circuit views showing configuration of switch shown in FIG. 4;

FIG. 17 is a table showing one example of the relationship of the NF and the IM3 when it causes the gain of the variable gain amplifier to be changed to combine respectively provided for the variable gain amplifying device of the present invention.

DETAILED DESCRIPTION OF THE PREFERRED EMBODIMENTS

A preferred embodiment of the variable gain amplifying device according to the present invention will be described in detail in accordance with the accompanying drawings.

Figure 1:
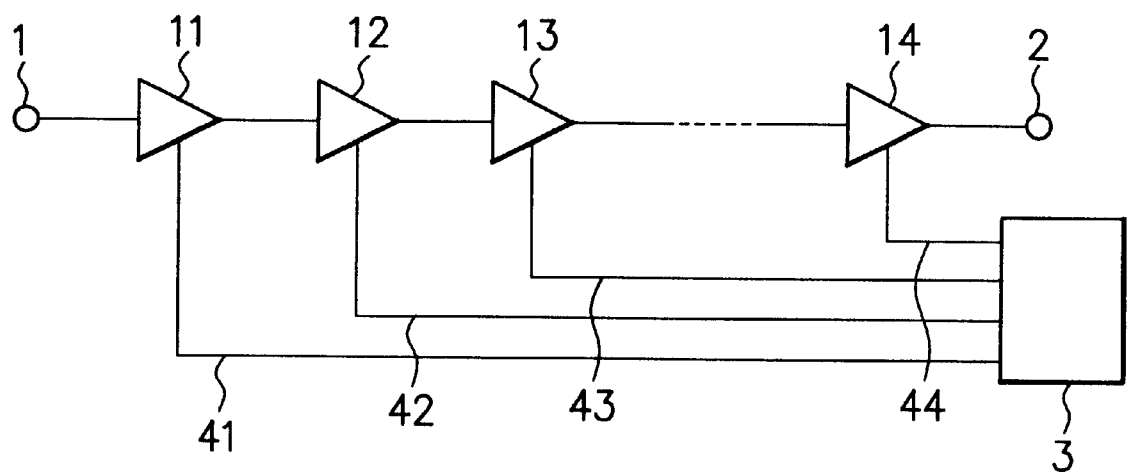
FIG. 1 is a circuit view showing a configuration of a conventional variable gain amplifying device.
Figure 4:
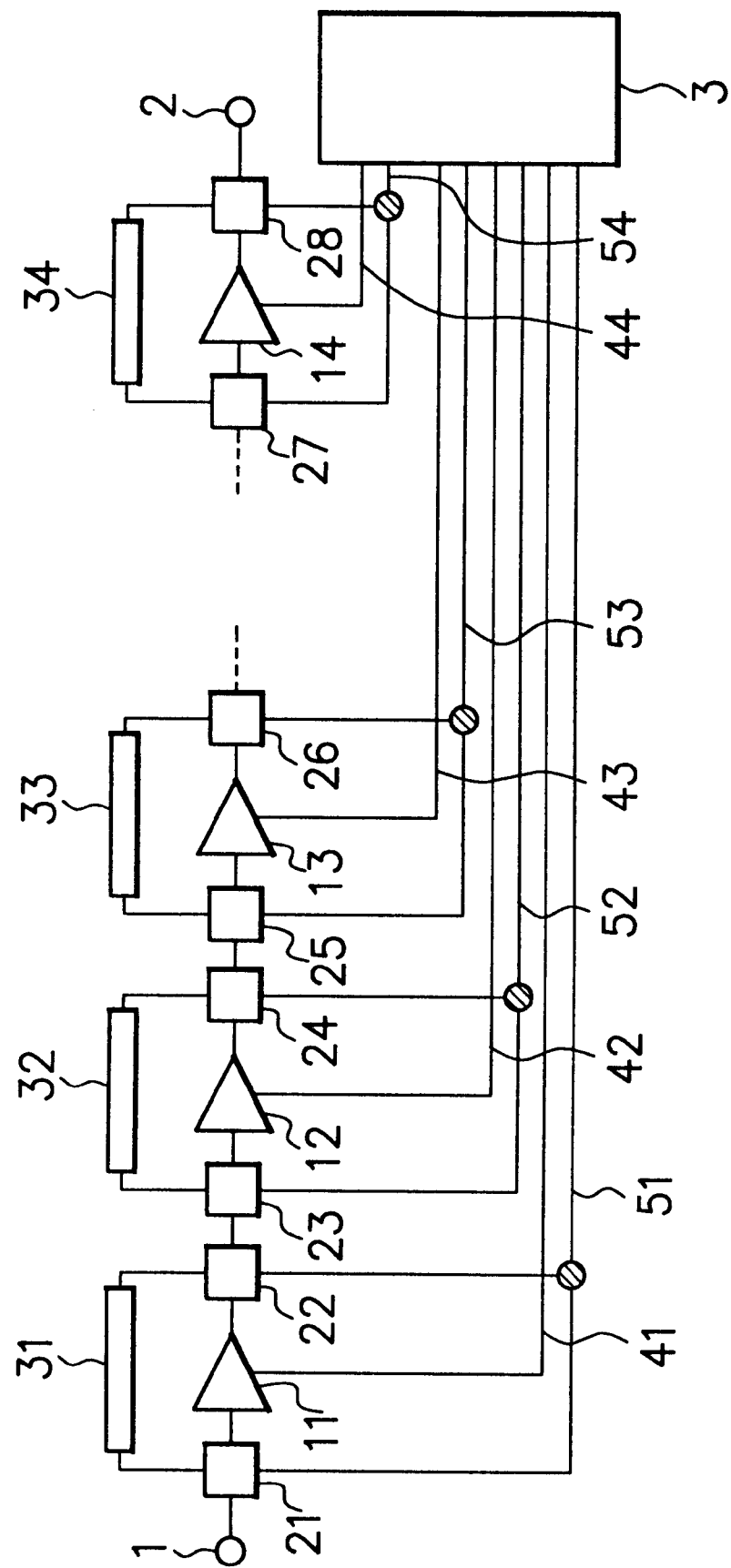
FIG. 4 is a circuit view showing a configuration of a first embodiment of a variable gain amplifying device according to the present invention.

FIG. 4 is a circuit view showing a configuration of the first embodiment of the variable gain amplifying device according to the present invention. However, in FIG. 4, there is added the same number to the same element as that of the variable gain amplifying device shown in FIG. 1.

As shown in FIG. 4, the variable gain amplifying device according to the first embodiment is provided with the variable gain amplifiers 11 to 14 of n stages from an input terminal 1 to an output terminal 2 therebetween. There are provided with through lines 31 to 34 in parallel to these variable gain amplifiers 11 to 14 respectively. Furthermore, there are provided input/output change switches 21, 23, 25, . . . 27 by way of input change switch at the input side of the variable gain amplifiers 11 to 14, and there are provided input/output change switches 22, 24, 26, . . . 28 by way of output change switch at the output side of the variable gain amplifiers 11 to 14.

Furthermore, respective variable gain amplifiers 11 to 14 are controlled by a control circuit 3 through gain control signal lines 41 to 44, and the respective input/output change switches 21 to 28 are controlled by the control circuit 3 through switch change signal lines 51 to 54.

Thus, the configuration of the variable gain amplifying device according to the first embodiment, as is clear referring to FIG. 4, is that respective input/output sections of the variable gain amplifiers 11 to 14 constituted by n stages are provided with the input/output change switches 21 to 28, and the through lines 31 to 34 are connected to another end of the input/output change switches 21 to 28 so as to become parallel to respective stages of the variable gain amplifier.

The variable gain amplifiers 11 to 14 and the input/output change switches 21 to 28, as described above, are connected to the control circuit 3 through gain control signal lines 41 to 44, and the switch change signal lines 51 to 54 respectively.

The control circuit 3 enables the gain of the variable gain amplifiers 11 to 14 to be established in every amplifier through the gain control signal lines 41 to 44, such that when the gain of the variable gain amplifiers 11 to 14 is established more than 0 dB, it causes the input/output change switches 21 to 28 of that stage to be connected to the side of the variable gain amplifiers 11 to 14, while when the established value of respective stages becomes less than 0 dB, the control circuit 3 causes the switch in front and behind of that stage to be changed simultaneously to the side of the through lines 31 to 34 through the switch change signal lines 51 to 54, thus permitting the variable gain amplifier to be separated in terms of the stage whose gain became less than 0 dB.

Next, there will be described detailed configuration of the input/output change switches 21 to 28 shown in FIG. 4 referring to FIGS. 5A, and 5B. Figs. 5A, and 5B show one example of the configuration of the input/output change switches 21 to 28 shown in FIG. 4. FIG. 5A is a block diagram showing an outline constitution of one example. FIG. 5B is a circuit view showing one example thereof.

FIG. 5A is the block diagram showing the input/output change switches 21 to 28 which are provided for the first embodiment of the variable gain amplifying device according to the present invention. A switch for use in an input section of the variable gain amplifiers 11 to 14 is an one-input two-outputs switch, while a switch for use in an output section of the variable gain amplifiers 11 to 14 is a two-inputs one-output switch.

Anyone of them is a Single Pole Dual Through switch (hereinafter referring to SPDT), in lot of cases, there is used a field-effect transistor (hereinafter referring to FET).

Next, circuit FIG. 5B is a circuit view showing a general circuit example of the above input/output change switch. Since the one-input two-outputs switch has the same constitution as that of the two-inputs one-output switch, there will be described the input/output change switch 21 as an example of the one-input two-outputs switch shown in FIG. 4.

As shown in FIG. 5A, the input/output change switch 21 is provided with a switch input terminal 61, a first switch output terminal 62, a second switch output terminal 63, and a switch change signal input terminal 64, thus it is capable of being changed connection of the first switch output terminal 62 and the second switch output terminal 63 on the ground that the change signal is inputted to the switch change signal input terminal 64.

There will be described the input/output change switch 21 in detail referring to FIG. 5B. There is constituted the input/output change switch 21 in such a way that an FET 72 is inserted between the switch input terminal 61 and the first switch output terminal 62, an FET 73 is inserted between the switch input terminal 61 and the second switch output terminal 63, an FET 71 is inserted between the first switch output terminal 62 and a ground, and an FET 74 is inserted between the second switch output terminal 62 and the ground.

For instance, when there is applied a Low level signal to the switch change signal input terminal 64A, a High level signal to the switch change signal input terminal 64B, the FET 72, and the FET 74 become ON, while the FET 71, and the FET 73 become OFF, therefore, the switch input terminal 61 and the first switch output terminal 62 are connected to electrically, while the switch input terminal 61 and the second switch output terminal 63 are disconnected electrically.

To the contrary, when there is applied the High level signal to the switch change signal input terminal 64A, the Low level signal to the switch change signal input terminal 64B, the FET 72, and the FET 74 become OFF, while the FET 71, and the FET 73 become ON, therefore, the switch input terminal 61 and the first switch output terminal 62 are disconnected electrically, while the switch input terminal 61 and the second switch output terminal 63 are connected to electrically, so that there is operated the input/output change switch 21 by way of the switch for changing two output terminals.

At this time, it is capable of being connected the switch input terminal 61 and the first switch output terminal 62, or the switch input terminal 61 and the second output terminal 63 so far as high frequency signal at a degree of 3 GHz with low loss. There is sufficiently separated between the first switch output terminal 62 and the second switch output terminal 63.

Next, there will be described operation of the first embodiment of the variable gain amplifying device according to the present invention shown in FIG. 4 referring to the drawing. The variable gain amplifiers 11 to 14 of n stages permit the gain to be established in accordance with gain establishment signal (or gain establishment voltage) transmitted through the gain control signal lines 41 to 44 from the control circuit 3. Generally, the maximum gain in every one stage is approximately degree of 15 to 20 dB, and the minimum gain is approximately degree of −10 dB to −30 dB.

However, in a lot of cases, since distortion becomes problem. There is established the gain establishment range to approximately 0 dB to the maximum gain in the majority of cases. Hereinafter, in order to simplify explanation, there will be described operation in cases where the variable gain amplifying device of the present invention is a variable gain amplifying device of three stages configuration in which there is three stages of variable gain amplifiers. In FIG. 4, description is that there are the variable gain amplifiers more than four pieces, however, hereinafter, there will be regarded number of the variable gain amplifier and number of element in connection with the variable gain amplifier as three.

There is supposed that the gain established range in every one stage of the variable gain amplifying device is set to 0 dB to 20 dB, the input/output change switches 21 to 28 with insertion loss of 0.5 dB are connected to the input/output section of respective stages of the variable gain amplifiers, and the through lines 31 to 34 with passing loss of 0.2 dB are connected to another terminal of the switch so as to be parallel to respective stages of the variable gain amplifiers 11 to 14.

In this case, by way of the through lines 31 to 34 shown in FIG. 4, it is suitable to use one which has characteristic impedance nearby 50 Ω or 75 Ω which are use in communication device. This three stages of the variable gain amplifying device is as a whole of the variable gain amplifying device of gain variable range of −3.6 dB to 57 dB.

The control method of the gain in this case is to adopt a control method in which the time of the maximum gain establishment is set to a starting point, subsequently, decreasing the gain gradually.

By way of the method in order to decrease the gain, there are following some methods. The first control method is a control method in which the gain is decreased from the initial stage of the variable gain amplifier, at the time when the gain of the initial stage of the variable gain amplifier becomes 0 dB, the gain is decreased at the next stage (second stage), at the time when the gain of the second stage of the variable gain amplifier becomes 0 dB, the gain is decreased from the third stage. To the contrary, the second control method is a control method in which the gain is decreased from the last stage (here, third stage) of the variable gain amplifier, at the time when the gain of the third (last) stage of the variable gain amplifier becomes 0 dB, the gain is decreased at the front stage (here second stage), at the time when the gain of the second stage of the variable gain amplifier becomes 0 dB, the gain is decreased from the further front stage (here initial stage). The third control method is a control method in which the gain is decreased from the second stage, at the time when the gain of the second stage of the variable gain amplifier becomes 0 dB, the gain is decreased from the next stage (here, third stage), at the time when gain of the third stage of the variable gain amplifier becomes 0 dB, the gain is decreased from the initial stage of the variable gain amplifier. The fourth control method is a control method in which the gain is decreased at the whole stage of the variable gain amplifier simultaneously.

When the gain is established to the minimum gain initially, and it permits the gain to increase gradually, the reverse procedure of the above process is implemented. In the selection out of these control methods, there is selected the appropriate control method in accordance with demand characteristic of the whole device in which the variable gain amplifying device is used.

For instance, in the system of severe demand for distortion, there is selected the control method in which the gain is decreased previously from the initial stage. In the system of severe demand for noise, there is selected the control method in which the gain is decreased previously from the last stage. In order to satisfy severe demand for distortion and noise, there is selected the control method in which the gain is decreased previously from the second stage, or the gain is decreased from the whole stages simultaneously.

In the first embodiment of the variable gain amplifying device of the present invention shown in FIG. 4, in any control method described above, when the gain of the variable gain amplifier of a certain stage is established to less than 0 dB by the control circuit 3 through the gain control signal lines 41 to 44, simultaneously, the switch change signal is transmitted from the control circuit 3 so as to be changed from the side of the variable gain amplifiers 11 to 14 to the side of the through lines 31 to 34 in response to the input/output change switches 21 to 28 provided for in front and behind of that stage through the switch change signal lines 51 to 54. There is disconnected the variable gain amplifiers 11 to 14 whose gain has become less than 0 dB, thus connecting the through lines 31 to 34.

To the contrary, when the gain of a certain stage is established such that the gain increases from 0 dB by the control circuit 3 through the control lines 41 to 44, simultaneously, the switch change signal is transmitted from the control circuit 3 so as to be changed from the side of the through lines 31 to 34 to the side of the variable gain amplifiers 11 to 14 in response to the input/output change switches 21 to 28 provided for in front and behind of that stage through the switch change signal lines 51 to 54. There is disconnected the through lines 31 to 34, thus connecting the variable gain amplifiers 11 to 14.

Consequently, according to the first embodiment of the variable gain amplifying device of the present invention shown in FIG. 4, when the gain of the variable gain amplifier has become less than 0 dB, the same variable gain amplifier is disconnected, for that reason, it is capable of achieving the improvement of the noise figure at the time of low gain and the third order intermodulation distortion.

Figure 11:
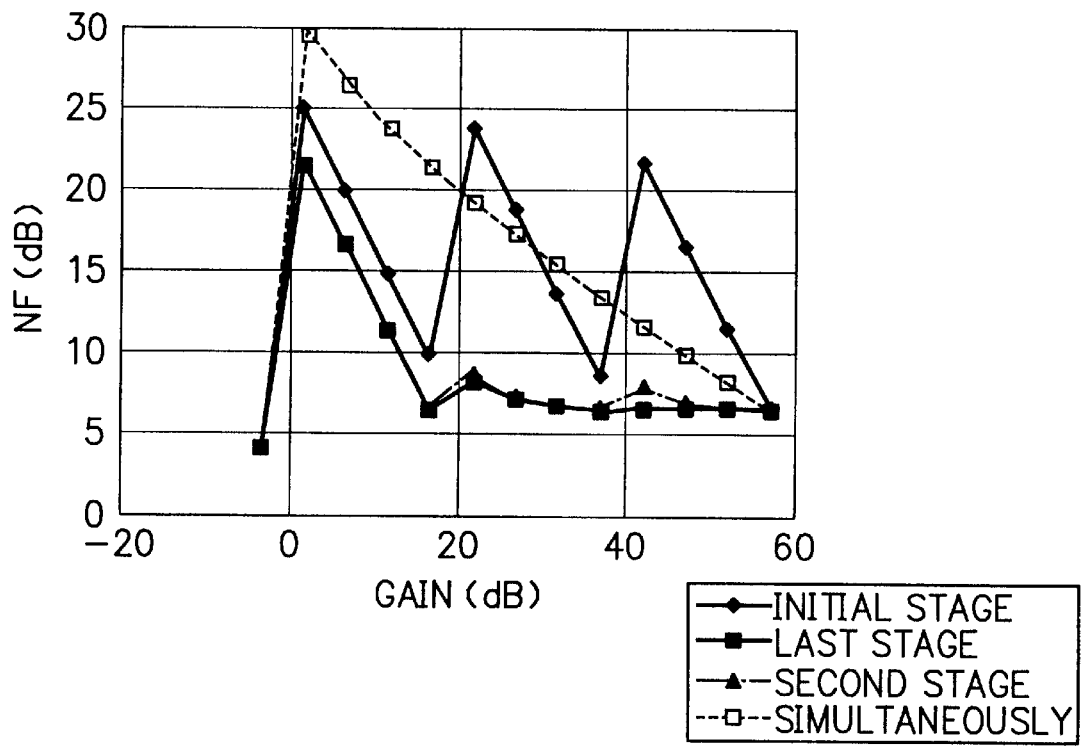
FIG. 11 is a graph showing the relationship between the gain and the NF of the variable gain amplifying device shown in FIG. 4.

Here, the effect of the first embodiment will be described more in detail referring to the drawing. The first effect is that it enables the NF (noise factor) to be improved when gain is established to low gain. FIG. 11 shows the relationship of the NF and the gain in the case where the variable gain amplifying device of the first embodiment is of the third stage configuration.

Figure 9:
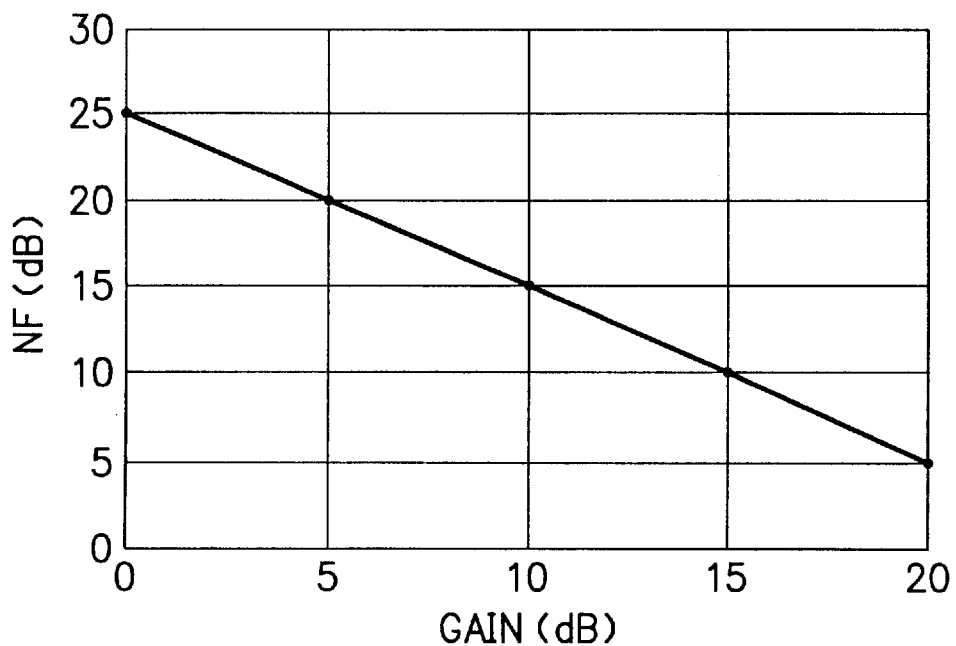
FIG. 9 is a graph showing characteristic between the gain and the NF according to the variable gain amplifier of the present invention and the prior art.

Here, in the graph shown in FIG. 11, the variable gain range in every one stage of the variable gain amplifiers 11 to 14 is set to 0 dB to 20 dB, the result in which simulation is executed on the assumption that the relationship between the gain and the NF has the characteristic shown in FIG. 9.

There is implemented the gain control using following four methods. The first control method is that it permits the gain to be decreased previously from the initial stage of the variable gain amplifier. The second control method is that it permits the gain to be decreased previously from the last stage of the variable gain amplifier. The third control method is that it permits the gain to be decreased previously from the second stage of the variable gain amplifier. The fourth control method is that it permits the gain to be decreased simultaneously from the whole stages of the variable gain amplifier.

Figure 2:
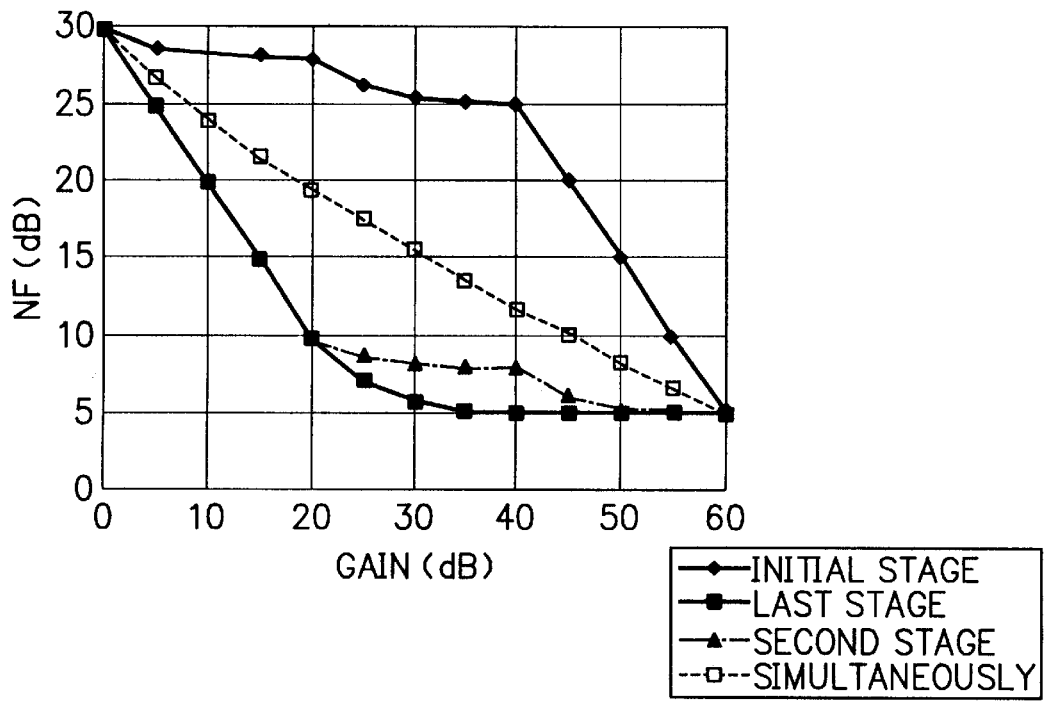
FIG. 2 is a graph showing a relationship between a gain and an NF of the conventional variable gain amplifying device.

As shown in FIG. 11, there is difference in value of the NF depending on the control method. The first control method in which it permits the gain to be decreased previously from the initial stage of the variable gain amplifier has the worst NF value of approximately 25 dB. The second control method in which it permits the gain to be decreased previously from the last stage of the variable gain amplifier has the worst NF value of approximately 21 dB. The third control method in which it permits the gain to be decreased previously from the second stage of the variable gain amplifier has the worst NF value of approximately 21 dB. The fourth control method in which it permits the gain to be decreased simultaneously from the whole stages of the variable gain amplifier has the worst NF value of approximately 29 dB. FIG. 2 shows the result of the simulation of the NF of the conventional three stage configuration of the variable gain amplifier under the same condition thereof.

Figure 12:
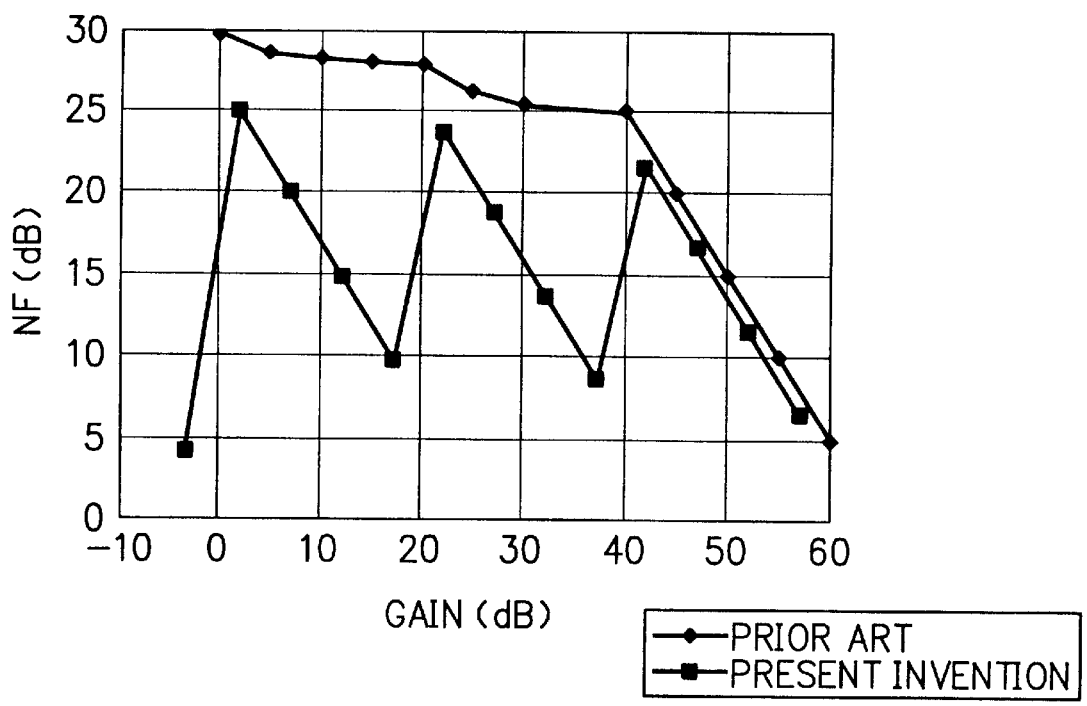
FIG. 12 is a graph showing the relationship between the gain and the NF of the variable gain amplifying device shown in FIG. 4 and the relationship between the gain and the NF of the conventional variable gain amplifying device.

Since the worst NF value is approximately 30 dB in any control method of the conventional three stage configuration of the variable gain amplifiers, the worst NF value of the control method in accordance with the present invention is improved by approximately 1 to 9 dB. There is shown the relationship between the NF and the gain in case where the control method is that the gain decreases previously from the initial stage of the variable gain amplifying device of the three stage configuration which is the first embodiment of the variable gain amplifying device according both to the prior art example and the present invention shown in FIG. 12 as easy to compare.

Figure 13:
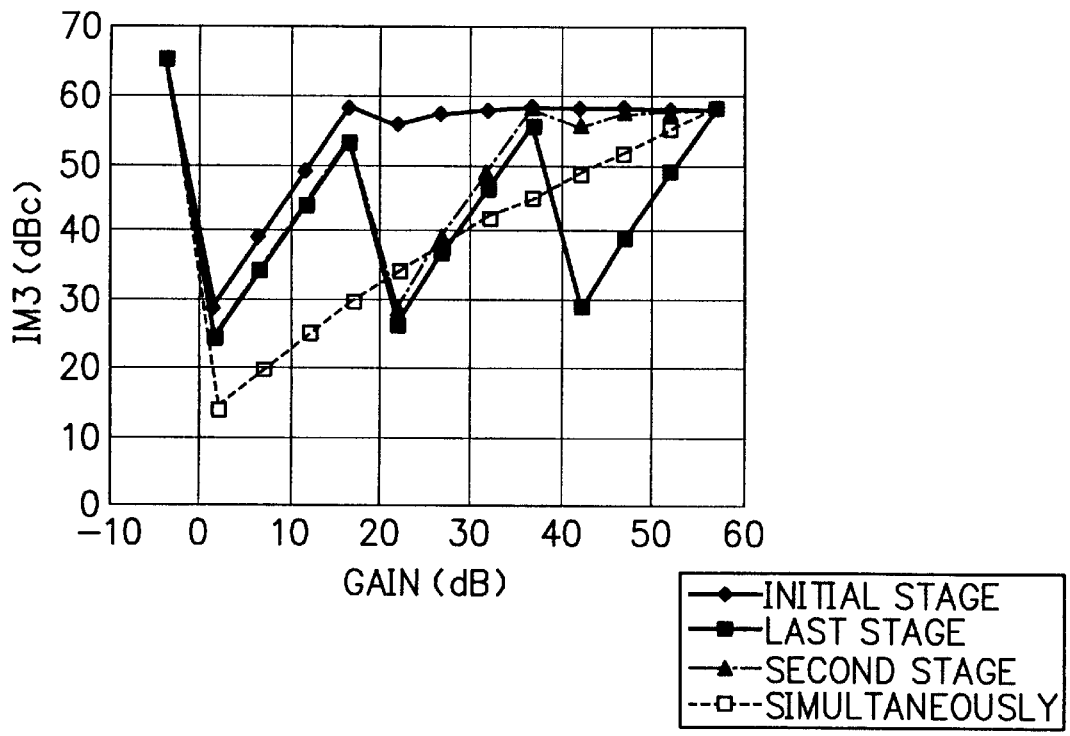
FIG. 13 is a graph showing the relationship between the gain and the IM3 of the variable gain amplifying device shown in FIG. 4.

The second effect is that it enables the IM3 to be improved in case where the gain is established low gain. There is described the improvement referring to FIG. 13. FIG. 13 shows the relationship between the IM3 and the gain of the variable gain amplifying device when the first embodiment of the variable gain amplifying device of the present invention is the three stage configuration of the variable gain amplifying device.

Figure 3:
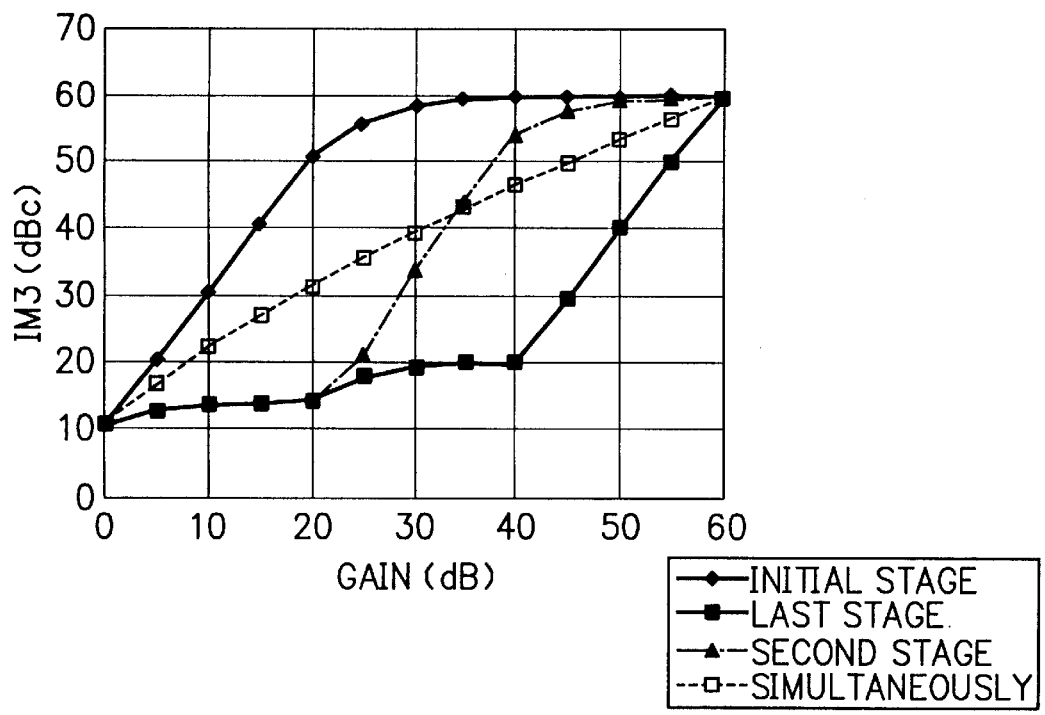
FIG. 3 is a graph showing a relationship between a gain and an IM3 of the conventional variable gain amplifying device.
Figure 10:
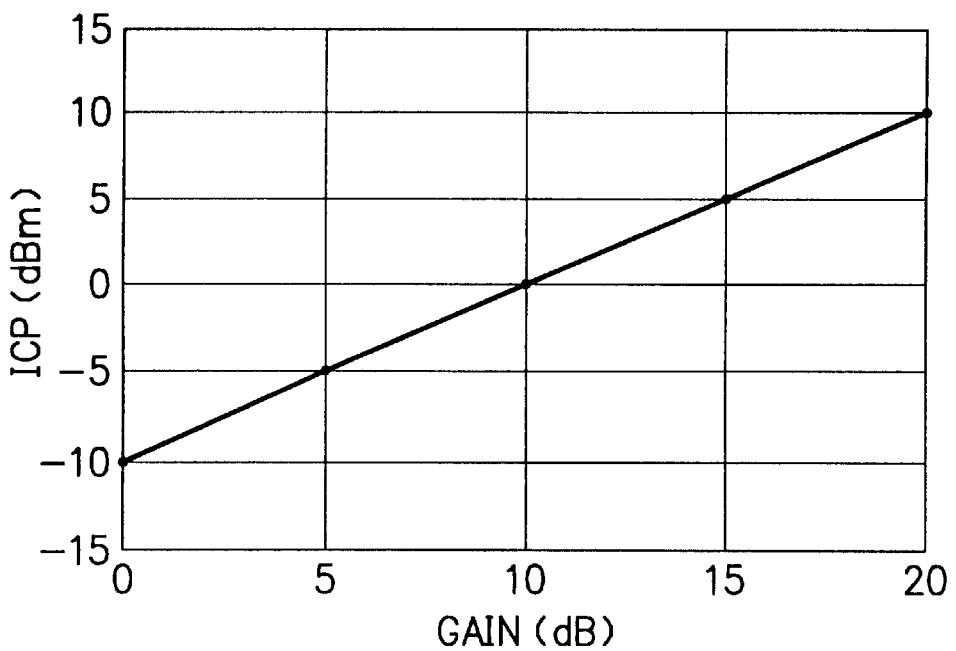
FIG. 10 is a graph showing characteristic between the gain and the ICP according to the variable gain amplifier of the present invention and the prior art.

Here, in the result shown in FIG. 3, the variable gain range in every one stage of the gain amplifiers 11 to 14 is set to 0 dB to 20 dB, and the relationship between the gain and the ICP of respective stages of the variable gain amplifiers has the characteristic shown in FIG. 10, thus the result in which the simulation is executed in such a way that the output power level in the output terminal 2 in response to the input power level of the input terminal 1 becomes −20 dBm is shown.

There is implemented the gain control using following four methods. The first control method is that it permits the gain to be decreased previously from the initial stage of the variable gain amplifier. The second control method is that it permits the gain to be decreased previously from the last stage of the variable gain amplifier. The third control method is that it permits the gain to be decreased previously from the second stage of the variable gain amplifier. The fourth control method is that it permits the gain to be decreased simultaneously from the whole stages of the variable gain amplifier.

Figure 14:
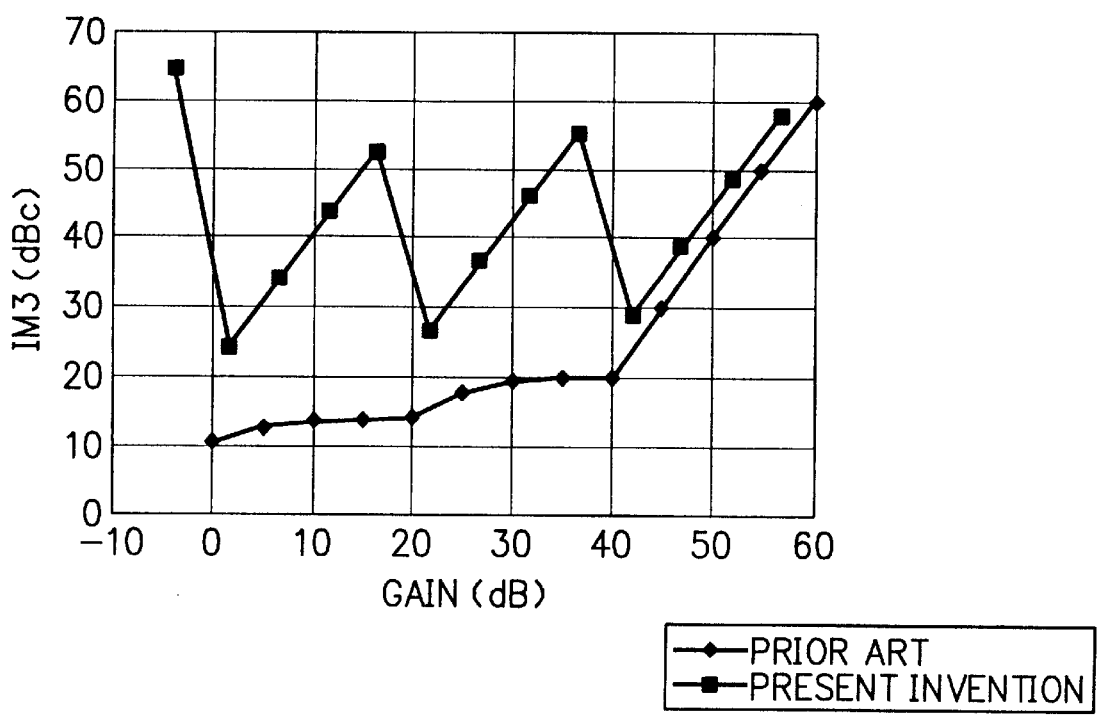
FIG. 14 is a graph showing the relationship between the gain and the IM3 of the variable gain amplifying device shown in FIG. 4 and the relationship between the gain and the IM3 of the conventional variable gain amplifying device.

As shown in FIG. 11, there is difference in value of the IM3 depending on the control method. The first control method in which it permits the gain to be decreased previously from the initial stage of the variable gain amplifier has the worst value of the IM3 of approximately 29 dBc. The second control method in which it permits the gain to be decreased previously from the last stage of the variable gain amplifier has the worst value of the IM3 of approximately 24 dBc. The third control method in which it permits the gain to be decreased previously from the second stage of the variable gain amplifier has the worst value of the IM3 of approximately 24 dBc. The fourth control method in which it permits the gain to be decreased simultaneously from the whole stages of the variable gain amplifier has the worst value of the IM3 of approximately 14 dBc. FIG. 2 shows the result of the simulation of the IM3 of the conventional three stage configuration of the variable gain amplifier under the same condition thereof. Since the worst value of the IM3 is approximately 11 dBc in any control method of the conventional three stage configuration of the variable gain amplifiers, the worst value of the IM3 in accordance with the present invention is improved by approximately 3 to 18 dB. There is shown the relationship between the IM3 and the gain in case where the control method is that the gain decreases previously from the last stage of the variable gain amplifying device of the three stage configuration which is the first embodiment of the variable gain amplifying device according both to the prior art example and the present invention shown in FIG. 14 as easy to compare.

Figure 6:
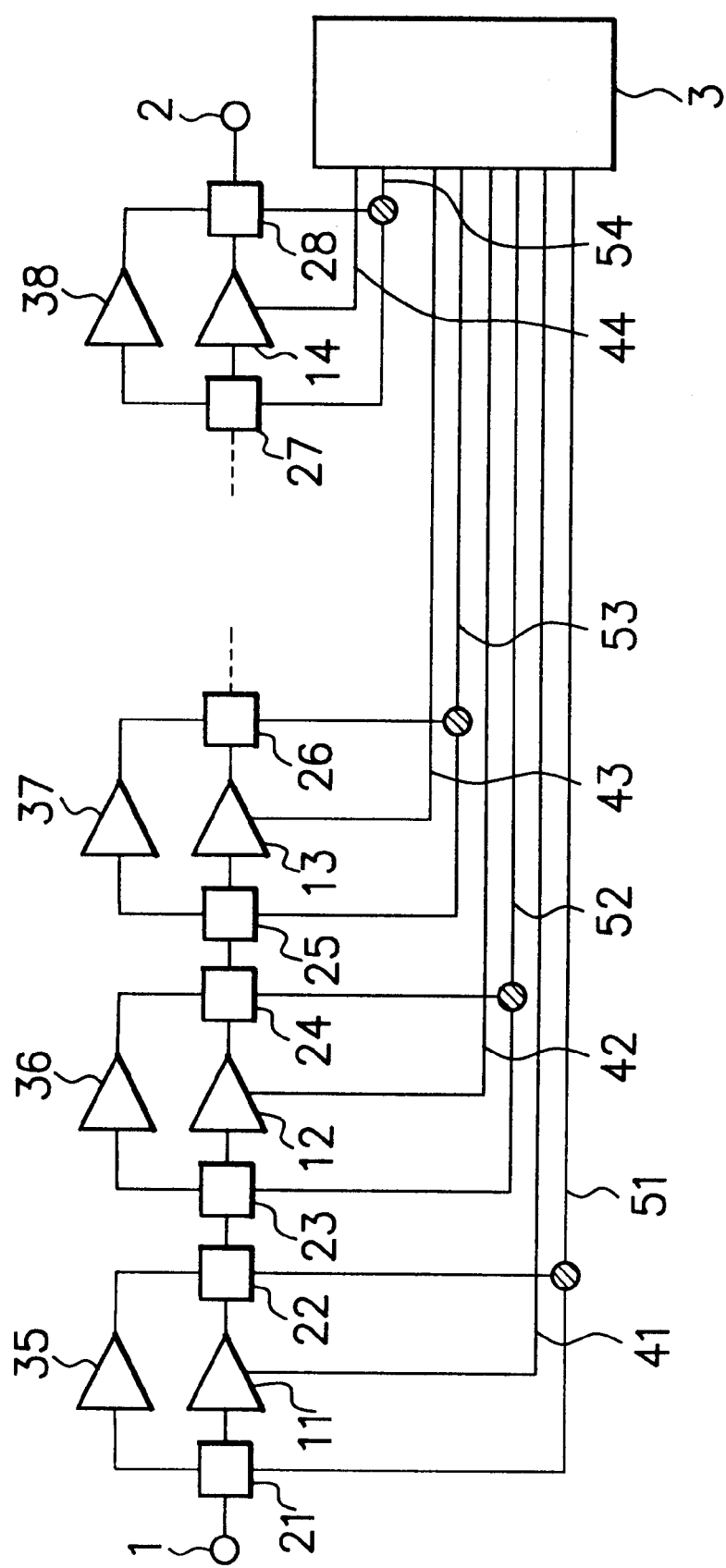
FIG. 6 is a circuit view showing a configuration of a second embodiment of a variable gain amplifying device according to the present invention.

Next, there will be described the second embodiment of the variable gain amplifying device according to the present invention referring to FIG. 6. FIG. 6 is a circuit view showing configuration of the second embodiment of the variable gain amplifying device of the present invention. There is added the same number to the same element as that of the variable gain amplifying device in the first embodiment of the present invention shown in FIG. 4.

There is difference between the configuration of the second embodiment of the variable gain amplifying device according to the present invention shown in FIG. 6 and the configuration of the first embodiment of the variable gain amplifier of the present invention previously described referring to FIG. 4. As is clear referring to FIG. 6, the difference is that there is substituted the through lines 31 to 34 shown in FIG. 4 for buffer amplifiers 35 to 38. The other points are the same as mutually.

It is suitable to use an emitter follower circuit of a bipolar transistor, a source follower circuit of FET (field effect transistor), or a voltage follower circuit using an operational amplifier by way of the buffer amplifier. The second embodiment has the effect that there is improved lowering of isolation effect between the output terminal 2 and the input terminal 1 at the time of low gain in the previously described first embodiment.

With regard to the improvement of the NF and the IM3 at the time of low gain, when the gain of respective variable gain amplifiers 11 to 14 becomes less than 0 dB, the connection of respective input/output change switches 21 to 28 is changed from the variable gain amplifier into the buffer amplifier by control of the control circuit 3, for that reason, executing the operation in which there is disconnected the respective variable gain amplifiers, consequently, there is obtained almost the same characteristic as that of the previously described first embodiment. The same as that of the first embodiment described previously, there is shown the simulation result between the gain and the NF in case where the variable gain amplifying device according to the second embodiment is of the three stage configuration as shown in FIG. 15, and there is shown the simulation result between the gain and the IM3 in FIG. 16.

Figure 15:
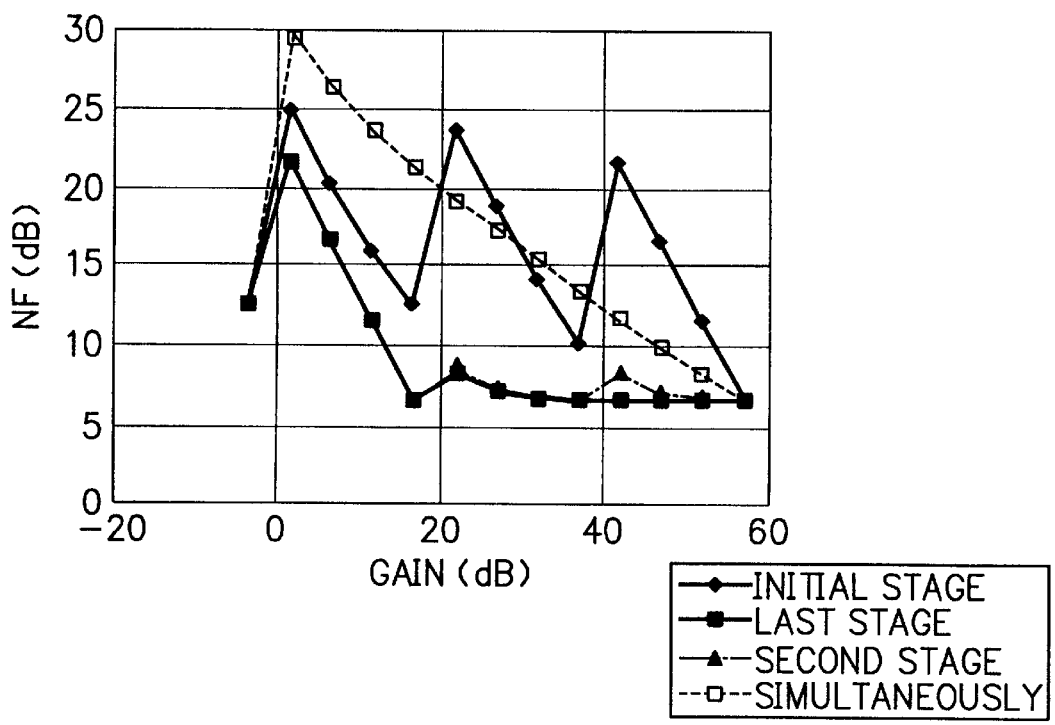
FIG. 15 is a graph showing the relationship between the gain and the NF of the variable gain amplifying device shown in FIG. 6.
Figure 16:
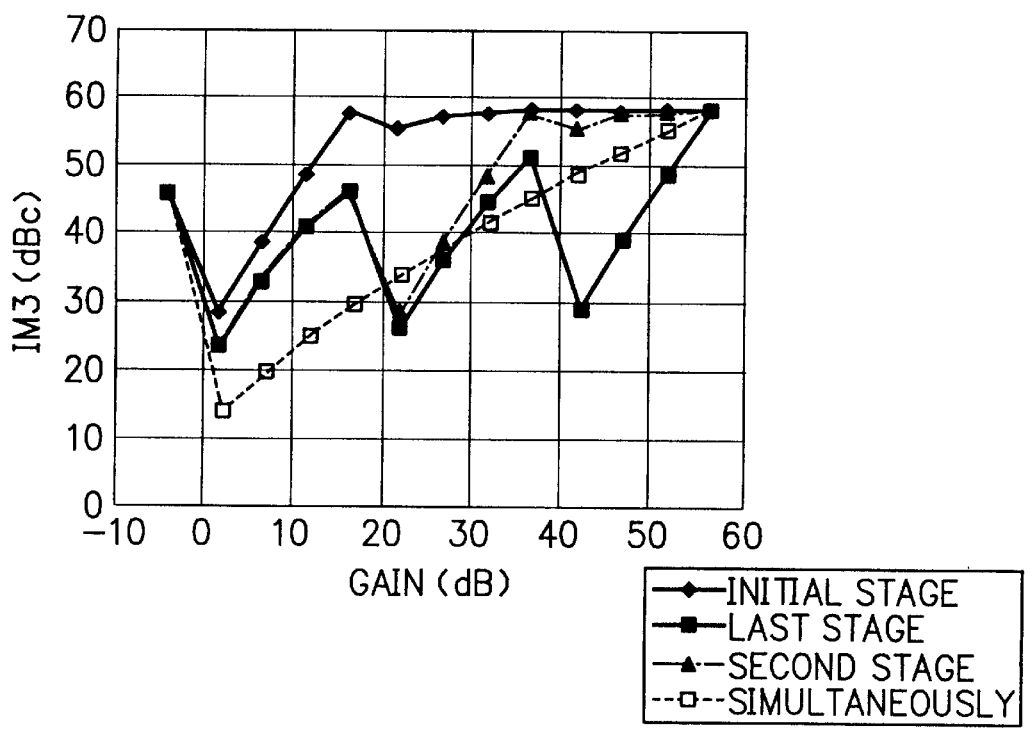
FIG. 16 is a graph showing the relationship between the gain and the IM3 of the variable gain amplifying device shown in FIG. 6.

As is clear when there is referred to the result shown in FIG. 15, the result shown in FIG. 16, the graph showing the relationship between the NF and the gain of the conventional gain amplifying device shown in FIG. 2, and the graph showing the relationship between the IM3 and the gain of the conventional variable gain amplifying device shown in FIG. 3, in the second embodiment of the variable gain amplifying device of the present invention described above, there is effect that the NF and the IM3 are greatly improved in particular, they are improved at the low gain which are the same effect as that of the first embodiment of the variable gain amplifying device of the present invention described previously, together with there is improved lowering of isolation effect between the output terminal 2 and the input terminal 1 at the time of low gain.

Figure 7:
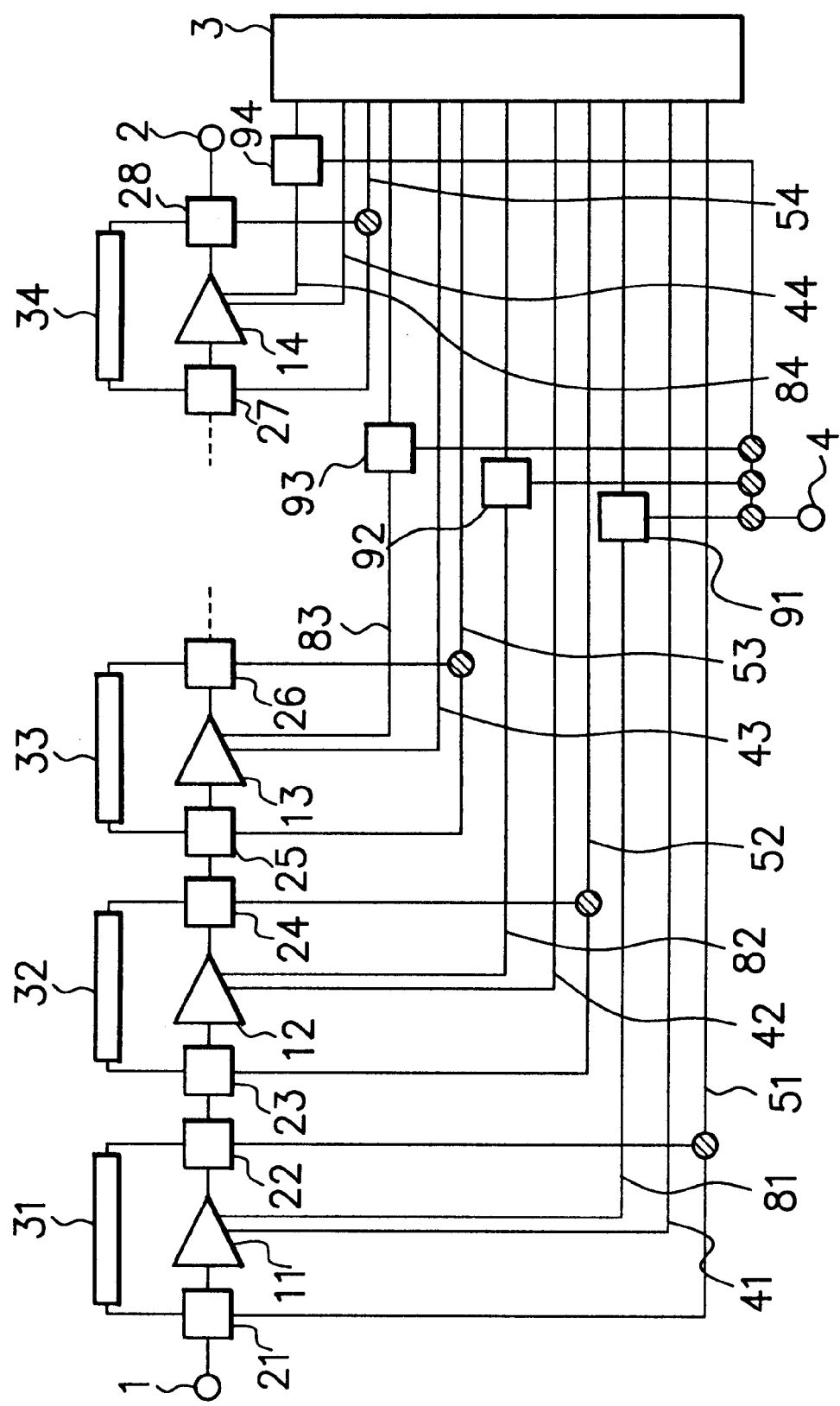
FIG. 7 is a circuit view showing a configuration of a third embodiment of a variable gain amplifying device according to the present invention.

Next, there will be described the third embodiment of the variable gain amplifying device of the present invention referring to FIG. 7. FIG. 7 is a circuit view showing configuration of the third embodiment of the variable gain amplifying device of the present invention. There is added the same number to the same element as that of the variable gain amplifying device shown in FIG. 4.

Referring to FIG. 7, there is difference between a configuration of the third embodiment and the configuration of the first embodiment shown in FIG. 4. The difference is that variable gain amplifying power source ON/OFF switches 91 to 94 are inserted between the power source and the power source terminal 4 of the variable gain amplifiers 11 to 14 of the first embodiment, such that the control circuit 3 enables the variable gain amplifying power source ON/OFF switches 91 to 94 to be controlled through variable gain amplifying power source ON/OFF lines 81 to 84. Other points are the same as that of the first embodiment described previously.

Operation of the third embodiment is implemented similarly to the operation of the first embodiment described previously in that when the gain of a certain stage is established to less than 0 dB by the control circuit 3 through the gain control signal lines 41 to 44, simultaneously, there is transmitted the switch change signal from the control circuit 3 so as to be changed from the side of the variable gain amplifiers 11 to 14 to the side of the through lines 31 to 34 toward the input/output change switches 21 to 28 provided in front and behind of that stage through the switch change signal lines 51 to 54, thus disconnecting the variable gain amplifiers 11 to 14 and connecting the through lines 31 to 34. By way of operation which does not exist in the first embodiment described previously, the control circuit 3 causes the variable gain amplifying power source ON/OFF switch of that stage to be OFF through the variable gain amplifying power source ON/OFF lines 81 to 84, so that it causes the power source of the disconnected variable gain amplifier to be OFF.

Consequently, in terms of the third embodiment, the same effect as that of the first embodiment described previously is obtained, together with there is the effect that it causes the power consumption to be reduced at the time of low gain because the power source of the variable gain amplifier disconnected is of the OFF state. With respect to the improvement of the NF and the IM3 at the time of low gain, the characteristic shown in FIGS. 11 and 13 is obtained similar to the first embodiment described previously.

Figure 8:
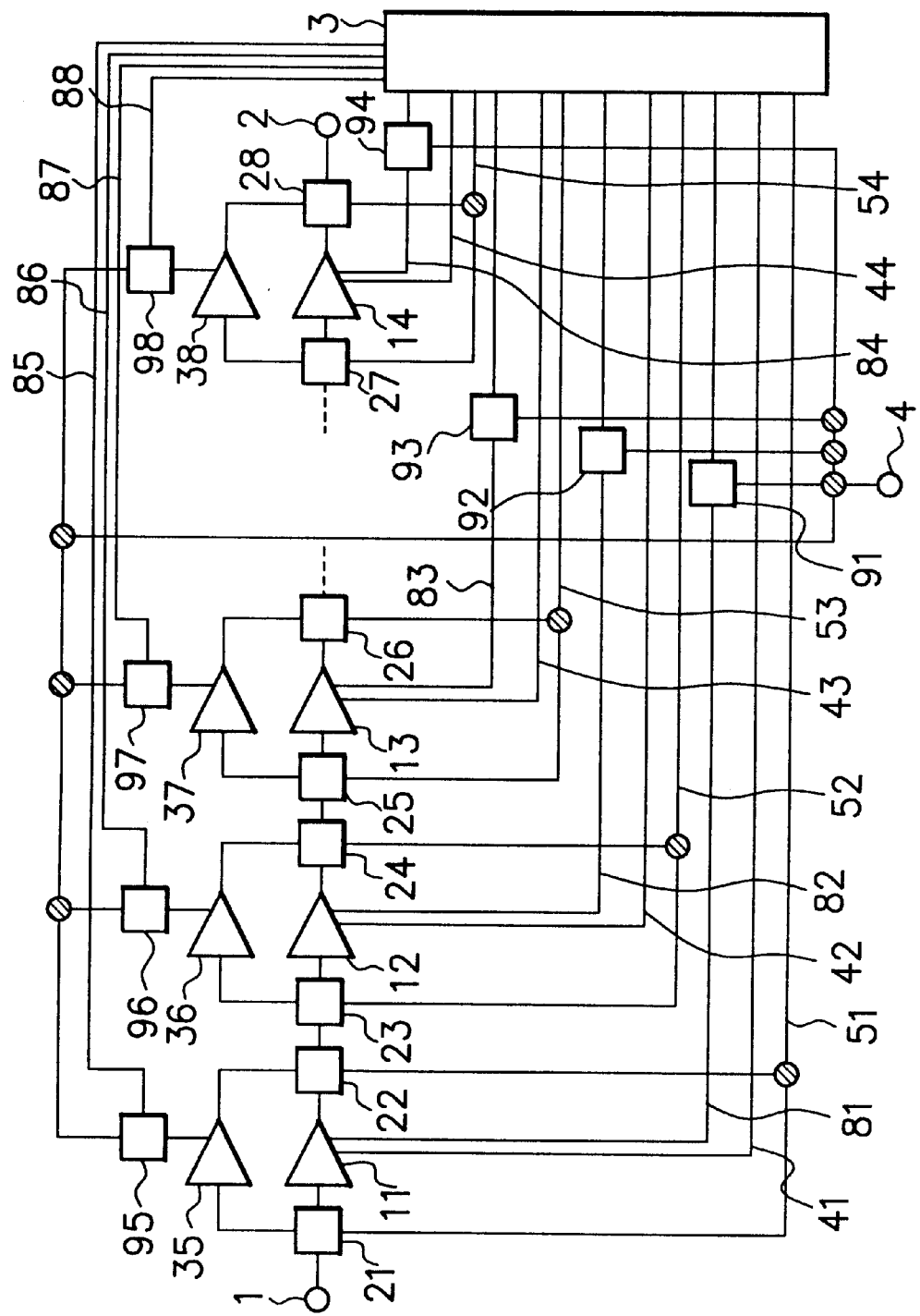
FIG. 8 is a circuit view showing a configuration of a fourth embodiment of a gain amplifying device according to the present invention.

Next, there will be described a fourth embodiment of the variable gain amplifying device according to the present invention in detail referring to the drawing. FIG. 8 is a circuit view showing a configuration of the fourth embodiment of the variable gain amplifying device of the present invention. There is added the same number to the same element as that of the second embodiment of the variable gain amplifying device of the present invention shown in FIG. 6.

There is difference between the configuration of the fourth embodiment shown in FIG. 8 and the configuration of the second embodiment shown in FIG. 6. The difference point is that there are inserted variable gain amplifying ON/OFF switches 91 to 94 between the power source and the power source terminal of the second embodiment, and buffer amplifier power source ON/OFF switches 95 to 98 between the power source and the power source terminal 4 of the buffer amplifier 35 to 38. Other points are the same as those of the second embodiment.

Consequently, the variable gain amplifying device of the fourth embodiment causes the variable gain amplifier to be separated after the gain having become less than 0 dB to connect to the buffer amplifier being similar to the second embodiment described previously. The control circuit 3 enables the variable gain amplifier power source ON/OFF switches 91 to 94 to be controlled through the variable gain amplifier power source ON/OFF signal lines 81 to 84. The control circuit 3 enables the buffer amplifier power source ON/OFF switches 95 to 98 to be controlled through the buffer amplifier power source ON/OFF signal lines 85 to 88 while inserting the buffer amplifier power source ON/OFF switches 95 to 98 between the power source and the power source terminal of the buffer amplifiers 35 to 38.

Consequently, by way of operation, when the gain of the variable amplifier of a certain stage is established to less than 0 dB by the control circuit 3 through the gain control signal lines 41 to 44, simultaneously, the switch change signal is transmitted from the control circuit 3 so as to be changed from the side of the variable gain amplifiers 11 to 14 to the side of the buffer amplifiers 35 to 38 toward the input/output change switches 21 to 28 of that stage through the switch change signal lines 51 to 54, thus causing the variable gain amplifiers 11 to 14 to be separated, before being connected the buffer amplifiers 35 to 38. Simultaneously, the control circuit 3 causes the power source for the variable gain amplifier to be OFF state by virtue of permitting the variable gain amplifier power source ON/OFF switches 91 to 94 of that stage to be OFF through the buffer amplifier power source ON/OFF signal lines 81 to 84, while the control circuit 3 causes the power source of the buffer amplifier to be ON by virtue of permitting the buffer amplifier power source ON/OFF switch of that stage to be ON through the buffer amplifier power source ON/OFF signal lines 85 to 88.

Consequently, when there is not located a by-pass on the buffer amplifier, the power source of the buffer amplifier is of OFF state, so that it enables the power consumption to be reduced.

As described above, the variable gain amplifying device of the fourth embodiment has the effect to reduce the power consumption at the time of low gain, together with there can be obtained the effect that it enables the improvement of the NF and the IM3 to be achieved at the time of low gain which is the same effect as that of the second embodiment described previously as shown in FIGS. 15, and 16.

Here, in the first embodiment, the second embodiment, the third embodiment, and the fourth embodiment described above, there is described the gain control in accordance with four methods of control method in that it causes the gain to be increased to the maximum gain initially, subsequently, the first control method is to decrease the gain previously from the initial stage, the second control method is to decrease the gain previously from the last stage, the third control method is to decrease the gain from the second stage, and the fourth control method is to decrease the gain simultaneously from the whole stages. The present invention is not limited by such the control method of the gain, further, it is capable of being changed the gain to be established while fitting the gain to aptitude of the device or system in which the variable gain amplifying device of the present invention is utilized.

For instance, the respective variable gain amplifiers used in the present invention enable the gain to be changed independently, therefore, when it permits a certain gain to be established by way of the variable gain amplifying device, it is capable of being executed the establishment of the gain while combining the gain of the respective variable gain amplifiers.

Here, there will be described the relationship between the NF and the IM3 in cases where it causes the gain of the variable gain amplifier provided for the variable gain amplifying device to be changed severally to be combined when there is changed the gain of the variable gain amplifying device of the present invention referring to FIG. 17. FIG. 17 is a table showing one example of the relationship of the NF and the IM3 in cases where it causes the gain of the variable gain amplifier to be changed severally to be combined such the variable gain amplifier is provided for the first embodiment of the variable gain amplifying device of the present invention.

However, the relationship shown in FIG. 17 shows the case by way of example where the first embodiment of the variable gain amplifier of the present invention is the variable gain amplifying device with the three stages configuration, and the gain to be established is 38 dB. Of course, the description described hereinafter, in the present invention, is materialized similarly in arbitrary stage number, arbitrary gain, and the another embodiment described previously without being limited by the case where the variable gain amplifying device is a variable gain amplifying device with the three stages configuration, and the gain to be established is 38 dB.

As shown in FIG. 17, when there is established the gain of the variable gain amplifying device for instance to 38 dB, there can be thought the cases where respective three stages of the variable gain amplifier are established as being with the initial stage as 20 dB, with the second stage as 18 dB, and with the last stage as 0 dB, or as being with the initial stage as 18 dB, with the second stage as 18 dB, and with the last stage as 2 dB, or as being with the initial stage as 20 dB, with the second stage as 0 dB, and with the last stage as 18 dB, or as being with the initial stage as 18 dB, with the second stage as 2 dB, and with the last stage as 18 dB, or the like, thus cases as being limitless number of combination can be thought.

Thus in accordance with the combination of these gains, the NF, and the IM3 become different values severally as shown in FIG. 17.

Consequently, for instance, in the case where the gain is 38 dB, if there is inputted the value of set of the NF and the IM3 obtained in accordance with various sets of the gain of the variable gain amplifier into the control circuit severally. The control circuit, at the time when there is established the gain, is capable of being obtained the value of appropriate set of the NF and the IM3, while referring to the combination of inputted gain of the variable gain amplifier, and the value of set of the NF and the IM3 corresponding thereto.

For that reason, even though any gain is established in the variable gain amplifying device, since the control circuit selects to be executed the combination of the gain of the variable gain amplifier so as to cause the NF and the IM3 to become the optimum value, it is capable of providing the variable gain amplifying device possible to select the optimum NF and IM3 all over the whole range.

Such the effect can be materialized only because each of the variable gain amplifier provided for the variable gain amplifying device enables the gain to be changed individually according to the present invention.

As is clear from the above description, according to the present invention, in the variable gain amplifying device which is constituted from at least, the variable gain amplifier as being more than one, since there is provided the switch for separating the variable gain amplifier whose gain has become 0 dB, to connect to the through line or to the buffer amplifier, there can be provided the variable gain amplifying device capable of improving greatly the NF and the IM3, in particular at the time of low gain.

Furthermore, in the case where the gain of the variable gain amplifier has become less than 0 dB, since there is provided the buffer amplifier at the route as being the by-pass for passing the signal, there can be provided the variable gain amplifying device capable of improving lowering of isolation effect between the output terminal and the input terminal at the time of low gain.

Moreover, since at least, any one of the input stage switch and the output stage switch is Single Pole Dual Through switch, there can be provided the variable gain amplifying device capable of executing accurately and quickly change of this switch.

Moreover, since there is provided the switch for causing the power source of the variable gain amplifier to be OFF, which is separated from the variable gain amplifying device, thus there is changed the switch in accordance with the state whether or not the gain of the variable gain amplifier is of more than 0 dB, there can be provided the variable gain amplifying device capable of reducing the power consumption.

Moreover, since there is provided the buffer amplifier switch which is capable of causing the power source to be OFF in terms of the buffer amplifier to which the signal is not inputted, thus there is changed the buffer amplifier switch in accordance with the state whether or not the signal is passed through the route as being the bypass toward the buffer amplifier, there can be provided the variable gain amplifying device capable of further reducing the power consumption.

Moreover, by way of the control method for establishing the gain of the variable gain amplifying device, it causes the gain to be increased to the maximum gain of the variable gain amplifying device, subsequently, decreasing the gain gradually. The variable gain amplifying device of the present invention can use all of four control methods that the first control method is to decrease the gain previously from the initial stage of the variable gain amplifier, the second control method is to decrease the gain previously from the last stage of the variable gain amplifier, the third control method is to decrease the gain from the second stage of the variable gain amplifier, and the fourth control method is to decrease the gain simultaneously from the whole stages of the variable gain amplifier, therefore, there can be provided the variable gain amplifying device capable of selecting the appropriate control method in accordance with the demand property of the device or the system in which the variable gain amplifying device is used.

Moreover, since there is executed the control of the gain of the variable gain amplifying device executed by the control signal outputted from the control circuit in such a way that it causes respective values of the gain of n stages of the variable gain amplifier to be combined severally such that the value of noise figure and third order inter modulation distortion of the variable gain amplifying device becomes the optimum value in the device or the system in which the variable gain amplifying device is used, even though the gain of the whole variable gain amplifying device is the same gain, it enables the value of the NF and the IM3 to possess width by virtue of combination of the gain of the variable gain amplifier, there can be easily provided the variable gain amplifying device capable of coping with various demand of the device or the system in which the variable gain amplifying device is used.

While preferred embodiments of the invention have been described using specific terms, such description is for illustrative purpose only, and it is to be understood that changes and variations may be made without departing from the spirit or scope of the following claims.

What is claimed is:

1. A variable gain amplifying device comprising:
   n stages, wherein n is an arbitrary natural number more than 1, each stage comprising:
   a variable gain amplifier capable of changing a gain in accordance with a gain control signal,
   an input stage switch provided at a respective input side of said variable gain amplifier for outputting a signal input into the stage to one of either said variable gain amplifier or said through line based on the control signal, and
   an output stage switch provided at a respective output side of said variable gain amplifier for changing an output of the stage to be a signal output from one of either said variable gain amplifier or said through line based on said control signal; and
   a control circuit for outputting said control signal.

2. A variable gain amplifying device as claimed in claim 1, wherein at least either one of said input stage switch and said output side switch is a Single Pole Dual Throw switch.

3. A variable gain amplifying device as claimed in claim 1 or 2, wherein control of the gain of said variable gain amplifying device is executed by the control signal output from the control circuit in such a way that the gain of said variable gain amplifying device is increased to a maximum value of the gain, subsequently decreasing the gain successively by using at least one control method of following four control methods in which:
   a first control method wherein the gain is decreased previously from an initial stage of said variable gain amplifier to 0 dB, when the gain of the variable gain amplifier of the initial stage becomes 0 dB, decreasing the gain of a variable amplifier of a next stage, when the gain of the variable gain amplifier of said next stage becomes 0 dB, decreasing the gain of a variable gain amplifier of two stages later, thus the gain is decreased previously from the initial stage of the variable gain amplifier;
   a second control method wherein the gain is decreased previously from a last stage of said variable gain amplifier to 0 dB, when the gain of the variable gain amplifier of the last stage becomes 0 dB, decreasing the gain of a variable gain amplifier of a front stage of the last stage, when the gain of the variable gain amplifier of the front stage becomes 0 dB, decreasing the gain of a variable gain amplifier of a next front stage of the last stage, thus the gain is decreased previously from the last stage of the variable gain amplifier;
   a third control method wherein the gain is decreased previously from a second stage of said variable gain amplifier to 0 dB, when the gain of the variable gain amplifier of the second stage becomes 0 dB, decreasing the gain of a variable gain amplifier of a next stage (third stage), when the gain of the variable gain amplifier of the next stage (third stage) becomes 0 dB, decreasing the gain of a variable gain amplifier of two next stages, subsequently, when the gain of a variable gain amplifier of the last stage becomes 0 dB, decreasing the gain of the variable gain amplifier of the initial stage, thus the gain is decreased previously from the second stage of the variable gain amplifier; and
   a fourth control method wherein the gain is decreased simultaneously from all the stages of the variable gain amplifier.

4. A variable gain amplifying device as claimed in claim 1 or 2, wherein there is executed a control of the gain of said variable gain amplifying device implemented in accordance with a control signal outputted from said control circuit according to a combination of various values of the gain of the variable gain amplifier of said n stages such that values of a noise figure and a third order intermodulation distortion of said variable gain amplifying device become most appropriate values in the system for which said variable gain amplifying device is in use.

5. A variable gain amplifying device as claimed in claim 1 or 2, wherein when the gain of said variable gain amplifier becomes less than 0 dB, said control circuit outputs said control signal in order to change connection of said input stage switch connected to a variable gain amplifier whose gain has become less than 0 dB from said variable gain amplifier into said through line, while when the gain of said variable gain amplifier becomes less than 0 dB, said control circuit outputs said control signal in order to change connection of said output stage switch connected to a variable gain amplifier whose gain has become less than 0 dB from said variable gain amplifier into said through line.

6. A variable gain amplifying device as claimed in claim 1, wherein there is provided an ON/OFF switch connected to a respective variable gain amplifier in order to control ON/OFF of a power source of said variable gain amplifier.

7. A variable gain amplifying device as claimed in claim 6, wherein when the gain of said variable gain amplifier becomes less than 0 dB, said control circuit outputs a control signal causing said ON/OFF switch to be OFF, wherein said ON/OFF switch is connected to the variable gain amplifier whose gain has become less than 0 dB.

8. A variable gain amplifying device comprising:

n stages, where n is an arbitrary natural number more than 1, each stage comprising:
- a variable gain amplifier capable of changing a gain based on a gain control signal,
- a buffer amplifier connected parallel to respective said variable gain amplifiers,
- an input stage switch provided at a respective input side of said variable gain amplifier for outputting a signal input into the stage to one of either said variable gain amplifier or said buffer amplifier based on the control signal, and
- an output stage switch provided at a respective output side of said variable gain amplifier for changing an output of the stage to be a signal output from one of either said variable gain amplifier or said buffer amplifier based on said control signal; and
- a control circuit for outputting said control signal.

9. A variable gain amplifying device as claimed in claim 8, wherein at least either one of said input stage switch and said output side switch is a Single Pole Dual Throw switch.

10. A variable gain amplifying device as claimed in claim 8 or 9, wherein control of the gain of said variable gain amplifying device is executed by the control signal output from the control circuit in such a way that the gain of said variable gain amplifying device is increased to a maximum value of the gain, subsequently decreasing the gain successively by using at least one control method of following four control methods in which:

a first control method wherein the gain to be decreased previously from an initial stage of said variable gain amplifier to 0 dB, when the gain of the variable gain amplifier of the initial stage becomes 0 dB, decreasing the gain of a variable amplifier of a next stage, when the gain of the variable gain amplifier of said next stage becomes 0 dB, decreasing the gain of a variable gain amplifier of two stages later, thus the gain is decreased previously from the initial stage of the variable gain amplifier;

a second control method wherein the gain is decreased previously from a last stage of said variable gain amplifier to 0 dB, when the gain of the variable gain amplifier of the last stage becomes 0 dB, decreasing the gain of a variable amplifier of a front stage of the last stage, when the gain of the variable gain amplifier of the front stage becomes 0 dB, decreasing the gain of a variable gain amplifier of a next front stage of the last stage, thus the gain is decreased previously from the last stage of the variable gain amplifier;

a third control method wherein the gain is decreased previously from a second stage of said variable gain amplifier to 0 dB, when the gain of the variable gain amplifier of the second stage becomes 0 dB, decreasing the gain of a variable gain amplifier of a next stage (third stage), when the gain of the variable gain amplifier of the next stage (third stage) becomes 0 dB, decreasing the gain of a variable gain amplifier of two next stages, subsequently, when the gain of a variable gain amplifier of the last stage becomes 0 dB, decreasing the gain of the variable gain amplifier of the initial stage, thus the gain is decreased previously from the second stage of the variable gain amplifier; and a fourth control method wherein the gain is decreased simultaneously from all the stages of the variable gain amplifier.

11. A variable gain amplifying device as claimed in claim 8 or 9, wherein there is executed a control of the gain of said variable gain amplifying device implemented in accordance with a control signal outputted from said control circuit according to a combination of various values of the gain of the variable gain amplifier of said n stages such that values of a noise figure and a third order intermodulation distortion of said variable gain amplifying device become most appropriate values in the system for which said variable gain amplifying device is in use.

12. A variable gain amplifying device as claimed in claim 8 or 9, wherein when the gain of said variable gain amplifier becomes less than 0 dB, said control circuit outputs said control signal in order to change connection of said input stage switch connected to a variable gain amplifier whose gain has become less than 0 dB from said variable gain amplifier into said buffer amplifier, while when the gain of said variable gain amplifier becomes less than 0 dB, said control circuit outputs said control signal in order to change connection of said output stage switch connected to a variable gain amplifier whose gain has become less than 0 dB from said variable gain amplifier into said buffer amplifier.

13. A variable gain amplifying device as claimed in claim 8, wherein there is provided an ON/OFF switch connected to a respective variable gain amplifier in order to control ON/OFF of a power source of said variable gain amplifiers.

14. A variable gain amplifying device as claimed in claim 13, wherein when the gain of said variable gain amplifier becomes less than 0 dB, said control circuit outputs a control signal causing said ON/OFF switch to be OFF, wherein said ON/OFF switch is connected to the variable gain amplifier whose gain has become less than 0 dB.

15. A variable gain amplifying device as claimed in claim 8, wherein there is provided a buffer amplifier ON/OFF switch connected to a respective buffer amplifier in order to control ON/OFF of a power source of said buffer amplifier.

16. A variable gain amplifying device as claimed in claim 15, wherein when the gain of said variable gain amplifier becomes less than 0 dB, said control circuit outputs a control signal causing said buffer amplifier ON/OFF switch connected in parallel to said variable gain amplifier whose gain has become less than 0 dB to be ON, wherein said buffer amplifier ON/OFF switch is connected to the buffer amplifier, thus causing said buffer amplifier to be ON.

* * * * *